(12) United States Patent
Nagata et al.

(10) Patent No.: US 8,673,392 B2
(45) Date of Patent: Mar. 18, 2014

(54) PERMANENT MAGNET AND METHOD OF MANUFACTURING SAME

(75) Inventors: Hiroshi Nagata, Ibaraki (JP); Kyuzo Nakamura, Kanagawa (JP); Takeo Katou, Kanagawa (JP); Atsushi Nakatsuka, Kanagawa (JP); Ichirou Mukae, Kanagawa (JP); Masami Itou, Kanagawa (JP); Ryou Yoshiizumi, Kanagawa (JP); Yoshinori Shingaki, Ibaraki (JP)

(73) Assignee: ULVAC, Inc., Kanagawa (JP)

( * ) Notice: Subject to any disclaimer, the term of this patent is extended or adjusted under 35 U.S.C. 154(b) by 482 days.

(21) Appl. No.: 12/440,748

(22) PCT Filed: Sep. 10, 2007

(86) PCT No.: PCT/JP2007/067572
§ 371 (c)(1),
(2), (4) Date: May 21, 2009

(87) PCT Pub. No.: WO2008/032667
PCT Pub. Date: Mar. 20, 2008

(65) Prior Publication Data
US 2009/0322459 A1  Dec. 31, 2009

(30) Foreign Application Priority Data

Sep. 14, 2006 (JP) .................................. 2006-249560

(51) Int. Cl.
*H01F 7/02* (2006.01)
*H01F 1/053* (2006.01)
(52) U.S. Cl.
USPC ...................... 427/127; 427/130; 428/822.3
(58) Field of Classification Search
USPC ................... 427/248, 250; 118/715, 723 VE; 428/822.3, 822.4, 822.5, 694 RE
See application file for complete search history.

(56) References Cited

U.S. PATENT DOCUMENTS 5,201,963 A * 4/1993 Mukai et al. .................. 148/104
7,402,226 B2  7/2008 Machida et al.
(Continued)

FOREIGN PATENT DOCUMENTS

JP  61250165  11/1986
JP  01-117303 A  5/1989
(Continued)

OTHER PUBLICATIONS

Kida, P., "Improvement of coercivity on thin Nd2Fe14B sintered permanent magnets," Doctor Thesis, Mar. 23, 2000, Tohoku University.

(Continued)

*Primary Examiner* — Michael Cleveland
*Assistant Examiner* — Tabassom Tadayyon Eslami
(74) *Attorney, Agent, or Firm* — Cermak Nakajima LLP; Tomoko Nakajima

(57) ABSTRACT

A permanent magnet is provided which has formed a Dy, Tb film on a surface of an iron-boron-rare earth sintered magnet of a predetermined shape, with diffusion thereof into grain boundary phases, having a higher coercive force. The method of manufacturing a permanent magnet includes a film-forming step of evaporating metal evaporating material containing at least one of Dy and Tb and adhering evaporated metal atoms to a surface of the iron-boron-rare earth sintered magnet, and a diffusing step of performing heat treatment to diffuse metal atoms adhered to the surface into grain boundary phases of the sintered magnet. The metal evaporating material contains at least one of Nd and Pr.

17 Claims, 11 Drawing Sheets

(56) References Cited

U.S. PATENT DOCUMENTS

| | | | |
|---|---|---|---|
| 2006/0144335 A1* | 7/2006 | Lee et al. | 118/719 |
| 2007/0034299 A1* | 2/2007 | Machida et al. | 148/105 |

FOREIGN PATENT DOCUMENTS

| | | | |
|---|---|---|---|
| JP | 1117303 | | 5/1989 |
| JP | 7258825 | | 10/1995 |
| JP | 2002363734 | | 12/2002 |
| JP | 2004-296973 | * | 10/2004 |
| JP | 2004-296973 A | | 10/2004 |
| JP | 2004-304038 A | | 10/2004 |
| JP | 2004304038 | | 10/2004 |
| JP | 2005-011973 | * | 1/2005 |
| JP | 2006-152352 A | | 6/2006 |
| JP | 2006152352 | | 6/2006 |
| WO | WO/2004/114333 | * | 12/2004 |
| WO | WO2006/100968 | | 9/2006 |

OTHER PUBLICATIONS

International Search Report for PCT Patent App. No. PCT/JP2007/067572 (Nov. 27, 2007).

Office Action from Chinese Patent App. No. 200780034225.7 (Nov. 8, 2011).

* cited by examiner (a)

| | Metal Evaporating Material (wt%) | | Br (kG) | iHc (kOe) | (BH)max (MGOe) | (BH)max+iHc |
|---|---|---|---|---|---|---|
| Comparative Example 1a | Dy | | 14.6 | 19.3 | 51.5 | 70.8 |
| Comparative Example 1b | Dy | | 14.6 | 17.1 | 51.6 | 68.7 |
| Embodiment 1 | 90Dy | 10Nd | 14.7 | 28.5 | 52.5 | 81.0 |
| | 80Dy | 20Nd | 14.7 | 28.3 | 52.7 | 81.0 |
| | 70Dy | 30Nd | 14.7 | 28.0 | 52.6 | 80.6 |
| | 60Dy | 40Nd | 14.7 | 27.9 | 52.8 | 80.7 |
| | 50Dy | 50Nd | 14.8 | 27.8 | 53.0 | 80.8 |
| | 40Dy | 60Nd | 14.8 | 27.3 | 53.1 | 80.4 |
| | 30Dy | 70Nd | 14.8 | 26.9 | 53.1 | 80.0 |
| | 20Dy | 80Nd | 14.8 | 26.0 | 53.2 | 79.2 |
| | 10Dy | 90Nd | 14.8 | 25.0 | 53.5 | 78.5 |
| | 1Dy | 99Nd | 14.9 | 24.5 | 54.0 | 78.5 |
| | 50Dy | 50Didymium | 14.9 | 27.9 | 54.1 | 82.0 |
| | 50Dy | 25Nd25Pr | 15.0 | 28.1 | 54.9 | 83.0 |
| | 50Dy | 50Pr | 15.0 | 28.5 | 55.0 | 83.5 |

FIG.8

| | Metal Evaporating Material (wt%) | | Br(kG) | iHc(kOe) | (BH)max(MGOe) | (BH)max+iHc |
|---|---|---|---|---|---|---|
| Comparative Example 2a | Tb | | 14.6 | 21.4 | 52.1 | 73.5 |
| Comparative Example 2b | Tb | | 14.6 | 16.8 | 51.8 | 68.6 |
| Embodiment 2 | 99Tb | 1Nd | 14.8 | 30.0 | 53.6 | 83.6 |
| | 97Tb | 3Nd | 14.9 | 33.4 | 54.9 | 88.3 |
| | 95Tb | 5Nd | 15.2 | 35.0 | 56.2 | 91.2 |
| | 93Tb | 7Nd | 14.9 | 34.5 | 55.0 | 89.5 |
| | 90Tb | 10Nd | 14.9 | 33.1 | 54.9 | 88.0 |
| | 80Tb | 20Nd | 14.8 | 32.5 | 54.3 | 86.8 |
| | 70Tb | 30Nd | 14.8 | 31.4 | 54.0 | 85.4 |
| | 60Tb | 40Nd | 14.8 | 30.3 | 53.9 | 84.2 |
| | 50Tb | 50Nd | 14.8 | 29.2 | 53.8 | 83.0 |
| | 40Tb | 60Nd | 14.7 | 29.0 | 53.4 | 82.4 |
| | 30Tb | 70Nd | 14.7 | 29.0 | 53.1 | 82.1 |
| | 20Tb | 80Nd | 14.7 | 28.9 | 53.1 | 82.0 |
| | 10Tb | 90Nd | 14.7 | 28.5 | 53.0 | 81.5 |
| | 50Tb | 50Didymium | 15.1 | 31.2 | 55.3 | 86.5 |
| | 50Tb | 25Nd25Pr | 15.2 | 32.5 | 55.9 | 88.4 |
| | 50Tb | 50Pr | 15.3 | 33.0 | 56.1 | 89.1 |

FIG.9

Metal Evaporating Material 90Dy10Nd

| | Element A | Mixing Ratio (wt%) | Br(kG) | iHc(kOe) | (BH)max(MGOe) | (BH)max+iHc |
|---|---|---|---|---|---|---|
| Comparative Example 3 | N/A | N/A | 14.0 | 30.1 | 47.9 | 78.0 |
| Embodiment 3 | Al | 50 | 14.0 | 36.0 | 47.8 | 83.8 |
| | Cu | 50 | 14.0 | 37.1 | 48.0 | 85.1 |
| | Ga | 1 | 14.0 | 36.1 | 47.9 | 84.0 |
| | Al+Cu | 50 | 14.0 | 38.1 | 47.7 | 85.8 |
| | Al+Ga | 20 | 14.0 | 38.3 | 47.9 | 86.2 |
| | Ga+Cu | 20 | 14.0 | 38.0 | 47.9 | 85.9 |
| | Ag | 50 | 14.0 | 33.5 | 47.5 | 81.0 |
| | B | 50 | 14.0 | 33.5 | 48.0 | 81.5 |
| | Ba | 50 | 14.0 | 33.6 | 47.5 | 81.1 |
| | Be | 50 | 14.0 | 33.6 | 47.1 | 80.7 |
| | C | 50 | 13.9 | 34.1 | 47.3 | 81.5 |
| | Ca | 50 | 14.0 | 33.9 | 47.7 | 81.6 |
| | Ce | 50 | 14.0 | 33.9 | 47.3 | 81.2 |
| | Co | 50 | 13.9 | 34.2 | 47.6 | 81.9 |
| | Cr | 50 | 13.9 | 34.4 | 47.3 | 81.7 |
| | Cs | 50 | 14.0 | 33.7 | 47.7 | 81.4 |
| | Er | 50 | 14.0 | 33.6 | 47.6 | 81.2 |
| | Eu | 50 | 14.0 | 33.6 | 47.5 | 81.1 |
| | Fe | 50 | 14.0 | 34.0 | 47.9 | 81.9 |
| | Gd | 50 | 13.9 | 34.4 | 47.7 | 82.1 |
| | Ge | 50 | 14.0 | 33.7 | 47.2 | 80.9 |
| | Hf | 50 | 14.0 | 33.6 | 48.0 | 81.6 |
| | Ho | 50 | 14.0 | 33.7 | 47.4 | 81.1 |
| | In | 50 | 13.9 | 34.4 | 48.0 | 82.4 |
| | K | 50 | 13.9 | 34.2 | 48.1 | 82.3 |
| | La | 50 | 14.0 | 33.5 | 47.5 | 81.0 |
| | Li | 50 | 13.9 | 34.2 | 47.4 | 81.6 |
| | Lu | 50 | 14.0 | 33.9 | 47.6 | 81.5 |
| | Mg | 50 | 14.0 | 33.6 | 47.7 | 81.4 |
| | Mn | 50 | 13.9 | 34.0 | 47.9 | 81.9 |
| | Mo | 50 | 13.9 | 34.2 | 47.3 | 81.4 |
| | Na | 50 | 14.0 | 33.7 | 47.9 | 81.6 |
| | Nb | 50 | 14.0 | 33.7 | 47.9 | 81.6 |
| | Ni | 50 | 14.0 | 33.9 | 47.8 | 81.6 |
| | P | 50 | 14.0 | 33.8 | 47.9 | 81.8 |
| | Pd | 50 | 14.0 | 33.6 | 47.8 | 81.4 |
| | Ru | 50 | 14.0 | 33.6 | 48.0 | 81.6 |
| | S | 50 | 13.9 | 34.2 | 47.6 | 81.8 |
| | Sb | 50 | 13.9 | 34.4 | 47.4 | 81.8 |
| | Si | 50 | 13.9 | 34.4 | 47.1 | 81.5 |
| | Sm | 50 | 13.9 | 34.3 | 47.9 | 82.2 |
| | Sn | 50 | 13.9 | 34.4 | 47.2 | 81.7 |
| | Sr | 50 | 14.0 | 33.9 | 47.2 | 81.2 |
| | Ta | 50 | 13.9 | 34.5 | 47.4 | 81.9 |
| | Ti | 50 | 14.0 | 33.9 | 47.7 | 81.6 |
| | Tm | 50 | 13.9 | 34.0 | 47.7 | 81.7 |
| | V | 50 | 14.0 | 34.0 | 47.8 | 81.8 |
| | W | 50 | 13.9 | 34.3 | 47.5 | 81.9 |
| | Y | 50 | 14.0 | 33.7 | 47.9 | 81.5 |
| | Yb | 50 | 14.0 | 33.9 | 47.5 | 81.4 |
| | Zn | 50 | 14.0 | 34.0 | 47.8 | 81.8 |
| | Zr | 50 | 14.0 | 33.8 | 47.7 | 81.6 |

FIG.10

Metal Evaporating Material 90Tb10Nd

|  | Element A | Mixing Ratio (wt%) | Br(kG) | iHc(kOe) | (BH)max(MGOe) | (BH)max+iHc |
|---|---|---|---|---|---|---|
| Comparative Example 4 | N/A | N/A | 14.2 | 35.3 | 49.1 | 84.4 |
| Embodiment 4 | Al | 1 | 14.3 | 40.3 | 50.1 | 90.4 |
|  | Cu | 1 | 14.6 | 39.6 | 51.8 | 91.4 |
|  | Ga | 0.1 | 14.4 | 39.1 | 50.5 | 89.6 |
|  | Al+Cu | 1 | 14.5 | 42.4 | 51.2 | 93.6 |
|  | Al+Ga | 0.5 | 14.3 | 41.6 | 50.9 | 92.5 |
|  | Ga+Cu | 0.5 | 14.5 | 41.1 | 51.0 | 92.1 |
|  | Ag | 1 | 14.2 | 37.8 | 49.7 | 87.6 |
|  | B | 1 | 14.2 | 37.7 | 50.4 | 88.1 |
|  | Ba | 1 | 14.3 | 37.2 | 49.9 | 87.1 |
|  | Be | 1 | 14.2 | 38.0 | 50.3 | 88.2 |
|  | C | 1 | 14.3 | 37.6 | 49.7 | 87.3 |
|  | Ca | 1 | 14.2 | 38.1 | 49.8 | 87.9 |
|  | Ce | 1 | 14.2 | 37.8 | 50.1 | 87.9 |
|  | Co | 1 | 14.2 | 37.9 | 49.7 | 87.5 |
|  | Cr | 1 | 14.2 | 38.0 | 49.5 | 87.5 |
|  | Cs | 1 | 14.2 | 38.2 | 49.4 | 87.6 |
|  | Er | 1 | 14.2 | 38.1 | 50.2 | 88.2 |
|  | Eu | 1 | 14.2 | 38.0 | 50.0 | 88.0 |
|  | Fe | 1 | 14.3 | 37.6 | 50.0 | 87.6 |
|  | Gd | 1 | 14.3 | 37.3 | 49.8 | 87.2 |
|  | Ge | 1 | 14.3 | 37.6 | 50.1 | 87.7 |
|  | Hf | 1 | 14.3 | 37.5 | 50.1 | 87.6 |
|  | Ho | 1 | 14.2 | 37.9 | 50.3 | 88.3 |
|  | In | 1 | 14.2 | 38.1 | 50.3 | 88.3 |
|  | K | 1 | 14.3 | 37.7 | 49.9 | 87.6 |
|  | La | 1 | 14.3 | 37.6 | 49.7 | 87.3 |
|  | Li | 1 | 14.3 | 37.6 | 49.6 | 87.2 |
|  | Lu | 1 | 14.2 | 37.8 | 49.7 | 87.5 |
|  | Mg | 1 | 14.3 | 37.3 | 50.2 | 87.5 |
|  | Mn | 1 | 14.3 | 37.2 | 50.4 | 87.6 |
|  | Mo | 1 | 14.2 | 37.8 | 50.3 | 88.2 |
|  | Na | 1 | 14.2 | 38.1 | 49.6 | 87.7 |
|  | Nb | 1 | 14.2 | 38.1 | 50.2 | 88.3 |
|  | Ni | 1 | 14.2 | 38.1 | 49.7 | 87.8 |
|  | P | 1 | 14.3 | 37.7 | 49.7 | 87.4 |
|  | Pd | 1 | 14.2 | 37.8 | 50.0 | 87.8 |
|  | Ru | 1 | 14.3 | 37.4 | 50.4 | 87.8 |
|  | S | 1 | 14.2 | 37.9 | 50.2 | 88.1 |
|  | Sb | 1 | 14.3 | 37.3 | 50.4 | 87.7 |
|  | Si | 1 | 14.2 | 38.2 | 49.6 | 87.8 |
|  | Sm | 1 | 14.2 | 38.0 | 49.9 | 87.9 |
|  | Sn | 1 | 14.2 | 37.7 | 50.3 | 88.1 |
|  | Sr | 1 | 14.3 | 37.6 | 49.6 | 87.2 |
|  | Ta | 1 | 14.2 | 37.9 | 49.9 | 87.7 |
|  | Ti | 1 | 14.3 | 37.5 | 50.1 | 87.6 |
|  | Tm | 1 | 14.3 | 37.6 | 50.4 | 88.0 |
|  | V | 1 | 14.2 | 38.2 | 49.8 | 88.0 |
|  | W | 1 | 14.3 | 37.6 | 49.9 | 87.6 |
|  | Y | 1 | 14.2 | 38.0 | 50.1 | 88.1 |
|  | Yb | 1 | 14.3 | 37.3 | 50.0 | 87.4 |
|  | Zn | 1 | 14.3 | 37.2 | 49.8 | 87.0 |
|  | Zr | 1 | 14.3 | 37.4 | 50.3 | 87.8 |

FIG.11

Metal Evaporating Material Dy+A Element

| | Element A | Mixing Ratio (wt%) | Br(kG) | iHc(kOe) | (BH)max(MGOe) | (BH)max+iHc |
|---|---|---|---|---|---|---|
| Comparative Example 5 | N/A | N/A | 14.0 | 22.3 | 47.9 | 70.2 |
| Embodiment 5 | Al | 50 | 14.0 | 27.5 | 47.5 | 75.0 |
| | Cu | 50 | 14.0 | 27.1 | 47.8 | 74.9 |
| | Ga | 1 | 14.0 | 27.3 | 47.7 | 75.0 |
| | Al+Cu | 50 | 14.0 | 29.1 | 47.4 | 76.5 |
| | Al+Ga | 20 | 14.0 | 29.5 | 47.4 | 76.9 |
| | Ga+Cu | 20 | 14.0 | 29.2 | 47.6 | 76.8 |
| | Ag | 50 | 14.0 | 25.3 | 47.2 | 72.5 |
| | B | 50 | 13.9 | 25.5 | 47.5 | 73.0 |
| | Ba | 50 | 13.9 | 25.5 | 47.2 | 72.7 |
| | Be | 50 | 13.9 | 25.5 | 47.4 | 73.0 |
| | C | 50 | 13.9 | 25.6 | 47.4 | 73.0 |
| | Ca | 50 | 14.0 | 25.1 | 47.5 | 72.5 |
| | Ce | 50 | 14.0 | 25.0 | 47.7 | 72.7 |
| | Co | 50 | 13.9 | 25.8 | 47.7 | 73.6 |
| | Cr | 50 | 14.0 | 25.0 | 47.1 | 72.1 |
| | Cs | 50 | 14.0 | 25.0 | 47.9 | 73.0 |
| | Er | 50 | 13.9 | 25.5 | 47.1 | 72.6 |
| | Eu | 50 | 14.0 | 25.3 | 47.1 | 72.5 |
| | Fe | 50 | 13.9 | 25.8 | 47.9 | 73.7 |
| | Gd | 50 | 13.9 | 25.8 | 47.6 | 73.4 |
| | Ge | 50 | 14.0 | 25.4 | 47.3 | 72.6 |
| | Hf | 50 | 13.9 | 25.7 | 47.5 | 73.2 |
| | Ho | 50 | 13.9 | 25.8 | 47.0 | 72.9 |
| | In | 50 | 14.0 | 25.1 | 47.5 | 72.6 |
| | K | 50 | 13.9 | 25.5 | 48.0 | 73.5 |
| | La | 50 | 13.9 | 25.8 | 47.6 | 73.4 |
| | Li | 50 | 13.9 | 25.7 | 47.2 | 72.8 |
| | Lu | 50 | 13.9 | 25.8 | 48.0 | 73.8 |
| | Mg | 50 | 13.9 | 25.5 | 47.2 | 72.7 |
| | Mn | 50 | 13.9 | 25.4 | 47.4 | 72.8 |
| | Mo | 50 | 14.0 | 25.3 | 47.3 | 72.6 |
| | Na | 50 | 13.9 | 25.5 | 47.1 | 72.6 |
| | Nb | 50 | 14.0 | 25.2 | 47.8 | 73.1 |
| | Ni | 50 | 13.9 | 25.5 | 47.1 | 72.6 |
| | P | 50 | 13.9 | 25.7 | 47.6 | 73.2 |
| | Pd | 50 | 14.0 | 25.4 | 47.1 | 72.5 |
| | Ru | 50 | 14.0 | 25.2 | 47.7 | 72.9 |
| | S | 50 | 13.9 | 25.8 | 47.4 | 73.2 |
| | Sb | 50 | 13.9 | 25.8 | 47.1 | 72.8 |
| | Si | 50 | 14.0 | 25.2 | 47.6 | 72.9 |
| | Sm | 50 | 13.9 | 25.8 | 47.5 | 73.2 |
| | Sn | 50 | 14.0 | 24.9 | 47.5 | 72.4 |
| | Sr | 50 | 13.9 | 25.6 | 47.7 | 73.3 |
| | Ta | 50 | 13.9 | 25.6 | 47.8 | 73.4 |
| | Ti | 50 | 13.9 | 25.8 | 47.3 | 73.0 |
| | Tm | 50 | 14.0 | 25.2 | 47.4 | 72.6 |
| | V | 50 | 14.0 | 24.9 | 47.3 | 72.2 |
| | W | 50 | 14.0 | 25.3 | 47.8 | 73.1 |
| | Y | 50 | 14.0 | 25.2 | 47.9 | 73.1 |
| | Yb | 50 | 14.0 | 25.3 | 47.7 | 73.1 |
| | Zn | 50 | 13.9 | 25.7 | 47.5 | 73.2 |
| | Zr | 50 | 13.9 | 25.5 | 47.0 | 72.5 |

FIG.12

Metal Evaporating Material Tb+A Element

| | Element A | Mixing Ratio (wt%) | Br(kG) | iHc(kOe) | (BH)max(MGOe) | (BH)max+iHc |
|---|---|---|---|---|---|---|
| Comparative Example 6 | N/A | N/A | 14.2 | 24.2 | 49.1 | 73.3 |
| Embodiment 6 | Al | 1 | 14.3 | 30.2 | 49.8 | 80.0 |
| | Cu | 1 | 14.3 | 29.9 | 50.0 | 79.9 |
| | Ga | 0.1 | 14.3 | 29.5 | 49.7 | 79.2 |
| | Al+Cu | 1 | 14.3 | 32.3 | 50.0 | 82.3 |
| | Al+Ga | 0.5 | 14.3 | 32.5 | 49.9 | 82.4 |
| | Ga+Cu | 0.5 | 14.4 | 32.0 | 50.2 | 82.2 |
| | Ag | 1 | 14.3 | 27.4 | 49.5 | 76.9 |
| | B | 1 | 14.3 | 25.0 | 49.3 | 74.3 |
| | Ba | 1 | 14.2 | 25.8 | 49.9 | 75.6 |
| | Be | 1 | 14.3 | 25.3 | 49.8 | 75.2 |
| | C | 1 | 14.3 | 25.5 | 49.3 | 74.8 |
| | Ca | 1 | 14.3 | 25.2 | 49.9 | 75.1 |
| | Ce | 1 | 14.2 | 25.6 | 49.2 | 74.8 |
| | Co | 1 | 14.2 | 25.1 | 49.2 | 74.3 |
| | Cr | 1 | 14.3 | 25.4 | 49.1 | 74.5 |
| | Cs | 1 | 14.2 | 25.1 | 49.2 | 74.3 |
| | Er | 1 | 14.2 | 25.2 | 49.1 | 74.4 |
| | Eu | 1 | 14.3 | 25.1 | 49.3 | 74.4 |
| | Fe | 1 | 14.2 | 25.6 | 49.3 | 74.9 |
| | Gd | 1 | 14.3 | 25.3 | 49.5 | 74.8 |
| | Ge | 1 | 14.2 | 25.2 | 49.8 | 75.1 |
| | Hf | 1 | 14.3 | 25.3 | 49.5 | 74.8 |
| | Ho | 1 | 14.3 | 25.1 | 49.5 | 74.6 |
| | In | 1 | 14.3 | 25.5 | 49.7 | 75.1 |
| | K | 1 | 14.2 | 25.6 | 49.4 | 75.0 |
| | La | 1 | 14.2 | 25.3 | 49.9 | 75.2 |
| | Li | 1 | 14.2 | 25.4 | 49.7 | 75.1 |
| | Lu | 1 | 14.3 | 25.3 | 49.9 | 75.2 |
| | Mg | 1 | 14.2 | 25.5 | 49.9 | 75.4 |
| | Mn | 1 | 14.3 | 25.7 | 49.5 | 75.2 |
| | Mo | 1 | 14.3 | 25.6 | 49.4 | 75.0 |
| | Na | 1 | 14.3 | 25.4 | 49.5 | 74.9 |
| | Nb | 1 | 14.2 | 25.3 | 49.7 | 75.0 |
| | Ni | 1 | 14.2 | 25.0 | 49.1 | 74.1 |
| | P | 1 | 14.3 | 25.8 | 49.1 | 74.9 |
| | Pd | 1 | 14.3 | 25.4 | 49.9 | 75.3 |
| | Ru | 1 | 14.3 | 25.9 | 49.8 | 75.7 |
| | S | 1 | 14.3 | 24.9 | 49.3 | 74.2 |
| | Sb | 1 | 14.2 | 25.3 | 49.1 | 74.5 |
| | Si | 1 | 14.3 | 25.1 | 49.6 | 74.7 |
| | Sm | 1 | 14.3 | 25.4 | 49.0 | 74.4 |
| | Sn | 1 | 14.2 | 25.4 | 49.7 | 75.1 |
| | Sr | 1 | 14.3 | 25.6 | 49.2 | 74.9 |
| | Ta | 1 | 14.2 | 25.2 | 49.4 | 74.6 |
| | Ti | 1 | 14.3 | 25.1 | 49.2 | 74.3 |
| | Tm | 1 | 14.2 | 25.6 | 49.3 | 74.9 |
| | V | 1 | 14.2 | 25.4 | 49.1 | 74.6 |
| | W | 1 | 14.2 | 25.8 | 49.6 | 75.4 |
| | Y | 1 | 14.3 | 25.5 | 49.8 | 75.3 |
| | Yb | 1 | 14.2 | 25.7 | 49.4 | 75.1 |
| | Zn | 1 | 14.2 | 25.1 | 49.3 | 74.4 |
| | Zr | 1 | 14.3 | 25.7 | 49.8 | 75.5 |

PERMANENT MAGNET AND METHOD OF MANUFACTURING SAME

This application is a national stage filing under 35 U.S.C. §371 of PCT Patent Application No. PCT/JP2007/067572, filed Sep. 10, 2007, which claims priority under 35 U.S.C. §119 to Japanese Patent Application No. 2006-249560, filed on Sep. 14, 2006, which are incorporated in their entireties by reference.

FIELD OF THE INVENTION

The present invention relates to a permanent magnet and a method of manufacturing the permanent magnet, and more particularly to a permanent magnet having high magnetic properties in which Dy and/or Tb are diffused into grain boundary phases of a Nd—Fe—B sintered magnet, as well as to a method of manufacturing the permanent magnet.

DESCRIPTION OF BACKGROUND ART

A Nd—Fe—B sintered magnet (so-called neodymium magnet) comprises a combination of Fe and elements of Nd and B that are cheap, abundant and constantly obtainable natural resources and thus can be manufactured at a low cost and additionally has high magnetic properties (its maximum energy product is about 10 times that of ferritic magnet). Accordingly the Nd—Fe—B sintered magnet has been used in various kinds of articles such as electronic devices and recently adopted in motors and electric generators for hybrid cars.

On the other hand, since the Curie temperature of the above sintered magnet is as low as about 300° C., there is a problem in that the Nd—Fe—B sintered magnet would be demagnetized by heat when heated to a temperature exceeding a predetermined temperature under a certain circumstantial condition in its adopted articles. In addition there is a further problem in that the magnetic properties would be extremely deteriorated by defects (e.g. cracks etc.) or strains in grains of the sintered magnet which are sometimes caused when the sintered magnet is machined to a desired configuration suitable for a particular article.

Therefore, when the Nd—Fe—B sintered magnet is obtained, it is considered to add Dy and Tb which largely improve the grain magnetic anisotropy of principal phase because they have magnetic anisotropy of 4 f electron larger than that of Nd and because they have a negative Stevens factor similar to Nd. However, since Dy and Tb take a ferrimagnetism structure having a spin orientation negative to that of Nd in the crystal lattice of the principal phase, the strength of magnetic field, accordingly the maximum energy product exhibiting the magnetic properties is extremely reduced.

In order to solve this kind of problem, it has been proposed: to form a thin film of Dy and Tb to a predetermined thickness (to be formed in a film thickness of above 3 μm depending on the volume of the magnet) over the entire surface of the Nd—Fe—B sintered magnet; then to perform heat treatment at a predetermined temperature; and to thereby homogeneously diffuse the Dy and Tb that have been deposited (formed into film) on the surface into the grain boundary phases of the magnet (see non-patent document 1).

[Non-patent document 1] Improvement of coercivity on thin Nd2Fe14B sintered permanent magnets (by Pak Kida (in Chinese reading) of Tohoku University Doctor Thesis, Mar. 23, 2000)

DISCLOSURE OF THE INVENTION

Problems to be Solved by the Invention

The permanent magnet manufactured in the above-described method has an advantage in that: because Dy and Tb diffused into the grain boundary phases improve the grain magnetic anisotropy of each of the grain boundary surfaces, the nucleation type of coercive force generation mechanism is strengthened; as a result, the coercive force is largely improved; and the maximum energy product will hardly be lost (it is reported in non-patent document 1 that a magnet having a performance of, e.g., the remanent flux density: 14.5 kG (1.45 T), maximum energy product: 50 MGOe (400 $Kj/m^3$), and coercive force: 23 KOe (3 MA/m)).

By the way if, e.g., the coercive force is further improved, a permanent magnet having strong magnetic force can be obtained even if the thickness of the permanent magnet is made thin. Therefore, in order to try to minimize the products using this kind of permanent magnets by decreasing the size, weight, and power consumption thereof, it is desired to develop permanent magnets having higher coercive forces and higher magnetic properties as compared with the above-described conventional art. In addition, since there are used Dy and Tb which are scanty in natural resources and stable supply cannot be expected, it is necessary to efficiently perform the film formation of Dy and Tb on the surface of the sintered magnet and diffusion into the grain boundary phases, to thereby improve the productivity and reduce the cost.

Therefore, in view of the above-described points, it is a first object of the invention to provide a permanent magnet which has extremely high coercive forces and high magnetic properties, and it is a second object of the invention to provide a method of manufacturing a permanent magnet of extremely high coercive forces and high magnetic properties, in which the permanent magnet can be manufactured at a high productivity and low cost.

Means for Solving the Problems

In order to solve the above-described problems, a method of manufacturing a permanent magnet according to claim 1 comprises: a film-forming step of evaporating metal evaporating material containing at least one of Dy and Tb and adhering evaporated metal atoms to a surface of an iron-boron-rare earth sintered magnet; and a diffusing step of performing heat treatment to diffuse metal atoms adhered to the surface into grain boundary phases of the sintered magnet. The metal evaporating material contains at least one of Nd and Pr.

According to this invention, by containing at least one of Nd and Pr in addition to at least one of Dy and Tb, Dy and Tb are replaced by the grains of Nd. Thus, in addition to the improvement in the magnetocrystalline anisotropy the strains and defects in the grain boundaries are repaired to thereby possess a higher coercive force. In addition, since Nd, etc., unlike Dy and Tb, takes a spin orientation in the same direction as Fe, remanent flux density and maximum energy product become high. As a result, as compared with the conventional one, it is possible to obtain a permanent magnet that has higher magnetic properties. On the other hand, the eutectic point of Nd—Fe is lower than the eutectic point of Dy—Fe or Tb—Fe (by about 200° C.). Therefore, the diffusion velocity of Dy, Tb becomes higher in the grain boundary and, as a result, the diffusion process can be performed at a shorter time, thereby attaining higher productivity.

Preferably the metal evaporating material further comprises at least one material of the group consisting of Al, Cu, and Ga. According to this arrangement, due to pluralistic eutectic effect, the melting point of Nd-rich phase lowers. The diffusion velocity of metal atoms of Dy and Tb further increases. In other words, in the diffusion process, elements of Al, Cu and Ga find their way into the Nd-rich phases to thereby form a complicated eutectic of Dy(Tb)—Nd(Pr)—Fe—Al (Cu, Ga), and the like. In this case, the eutectic point of the Nd-rich phases which are near the grain boundaries is lower in the case of the polytopic systems as compared with the eutectic point of the binary system of Dy—Fe(Tb—Fe). Therefore, the diffusion velocity of the metal atoms of Dy, Tb becomes still faster. In addition, at the time of diffusion process, due to the cleaning effect as a result of operation of the above-described elements on the grain boundaries, and due to an increase in the effective rare earths amount as a result of the reduction of the rare earths oxides through preferential oxidation of the above-described elements, there can be obtained a permanent magnet that has a still higher coercivity. In this case, as a result of positive reaction with harmful elements such as C which is the cause for the lowering in coercivity the effect of detriment can be lowered.

Even in case the above-described metal evaporating material further comprises at least one material of the group consisting of Ag, B, Ba, Be, C, Ca, Ce, Co, Cr, Cs, Er, Eu, Fe, Gd, Ge, Hf, Ho, In, K, La, Li, Lu, Mg, Mn, Mo, Na, Nb, Ni, P, Pd, Ru, S, Sb, Si, Sm, Sn, Sr, Ta, Ti, Tm, V, W, Y, Yb, Zn, and Zr, there can be obtained a similar effect as above.

If the film-forming step comprises; a first step of heating the processing chamber to evaporate the metal evaporating material disposed in the processing chamber to thereby form metal vapor atmosphere in the processing chamber; and a second step of transporting the sintered magnet that has been maintained to a temperature lower than the temperature in the processing chamber to thereby selectively cause the metal atoms in the metal vapor atmosphere to adhere to, and deposit on, the surface of the sintered magnet due to a difference in temperature between an inside of the processing chamber and the sintered magnet, the metal evaporating material can be deposited (film-formed) on the surface of the sintered magnet to a predetermined thickness at a high speed, whereby the productivity is further improved. In addition, Dy and Tb which are scanty as natural resources and cannot expect a stable supply can be recovered at a high yield, thereby reducing the cost.

In this case, if the metal vapor atmosphere is in a saturated state in the processing chamber, the metal evaporating material containing at least one of Dy, Tb can be film-formed (deposited) to the surface of the sintered magnet at a high speed.

On the other hand, it may be so arranged that the film-forming step and the diffusing step are performed by; disposing and heating the metal evaporating material and the sintered magnet in a same processing chamber to thereby evaporate the metal evaporating material; causing the evaporated metal atoms to be adhered to the surface of the sintered magnet that has been heated to substantially the same temperature, the adhering being made while adjusting an amount of supply of the metal atoms; and diffusing the adhered metal atoms into the grain boundary phases of the sintered magnet before a thin film made of the metal evaporating material is formed on the surface of the sintered magnet.

According to this arrangement, the evaporated metal atoms are supplied and adhered to the surface of the sintered magnet that has been heated to the predetermined temperature. At this time, the sintered magnet is heated to the temperature at which the most appropriate diffusion velocity can be obtained, and the amount of supply of the metal atoms to the surface of the sintered magnet is adjusted. Therefore, the metal atoms adhered to the surface are sequentially diffused into the grain boundary phases of the sintered magnet before the formation of the thin film (i.e., the supply of metal atoms of Dy, Tb, and the like to the surface of the sintered magnet and the diffusion into the grain boundary phases of the sintered magnet can be performed at the same time in a single processing). Therefore, the surface state of the permanent magnet is substantially the same as the state before the performance of the above-described process and, thus, the surface of the permanent magnet manufactured can be prevented from deteriorating (from becoming poor in surface roughness). And, in particular, the excessive diffusion of Dy and Tb into the grain boundaries near the surface of the sintered magnet can be restrained. Post process is thus not particularly required, thereby attaining a high productivity.

In this case, if the sintered magnet and the metal evaporating material are disposed at a distance from each other, when the metal evaporating material is evaporated, the melted metal evaporating material can be prevented from directly getting adhered to the sintered magnet.

In addition, if a specific surface area of the metal evaporating material to be disposed in the processing chamber is varied to increase or decrease the amount of evaporation at a constant temperature, thereby adjusting the amount of supply of the metal atoms, the amount of supply of the metal atoms to the surface of the sintered magnet can be advantageously adjusted without the change in the constitution of the apparatus such, e.g., as providing a separate part for increasing or decreasing the amount of supply of the metal atoms to the surface of the sintered magnet.

Prior to the film-forming step, in order to remove the stains, gas and moisture adsorbed into the surface of the sintered magnet before diffusing the metal atoms of Dy and Tb into the grain boundary phases, it is preferable to reduce the pressure inside the processing chamber to a predetermined pressure and to maintain the temperature thereat after disposing the sintered magnet inside the processing chamber.

In this case, in order to accelerate the removal of the stains, gas and moisture adsorbed into the surface, it is preferable that, after having reduced the processing chamber to the predetermined pressure, the processing chamber is heated to a predetermined temperature and maintaining the temperature thereat.

On the other hand, in order to remove the oxide film on the surface of the sintered magnet before diffusing the metal atoms of Dy, Tb, and the like into the grain boundary phases, preferably prior to the film-forming step, the surface of the sintered magnet is cleaned by plasma.

Further, after having diffused the metal atoms into the grain boundary phases of the sintered magnet, a heat treatment is preferably performed of removing the strain of the permanent magnet at a temperature lower than the temperature. Then, a permanent magnet of high magnetic properties can be obtained in which the magnetization and coercive force have been further improved or recovered.

Further, in order to solve the above-described problems, the permanent magnet according to claim 13 is made by evaporating metal evaporating material containing at least one of Dy and Tb and at least one of Nd and Pr to a surface of an iron-boron-rare earth sintered magnet. Metal atoms of the evaporated metal evaporating material are thereby adhered to the surface and the adhered metal atoms are subsequently diffused into grain boundary phases through heat treatment.

In this case, preferably the metal evaporating material further comprises at least one material of the group consisting of Cu, Al, and Ga.

In addition, the metal evaporating material may further comprise at least one material of the group consisting of Ag, B, Ba, Be, C, Ca, Ce, Co, Cr, Cs, Er, Eu, Fe, Gd, Ge, Hf, Ho, In, K, La, Li, Lu, Mg, Mn, Mo, Na, Nb, Ni, P, Pd, Ru, S, Sb, Si, Sm, Sn, Sr, Ta, Ti, Tm, V, W, Y, Yb, Zn, and Zr.

Effects of the Invention

As described hereinabove, the permanent magnet according to the invention has an effect in that, as compared with the conventional one, the coercive force is higher with high magnetic properties. According to the manufacturing method of manufacturing the permanent magnet of this invention, the permanent magnet can be manufactured with high productivity at a low cost.

BEST MODE FOR CARRYING OUT THE INVENTION

With reference to FIGS. 1 and 2, a permanent magnet M of the present invention can be manufactured by simultaneously performing a series of processes (vacuum vapor processing) of: a film-forming step in which metal evaporating material V to be described hereinafter is caused to be evaporated and the evaporated metal atoms are adhered to a surface of a Nd—Fe—B sintered magnet S machined to a predetermined shape; and a diffusing step in which the metal atoms adhered to the surface of the sintered magnet S are diffused into the grain boundary phases so as to be homogeneously penetrated.

The starting material of the Nd—Fe—B sintered magnet S is manufactured as follows by a known method. That is, first, an alloy member having a thickness of 0.05 mm~0.5 mm is manufactured by the known strip casting method by formulating Fe, B and Nd at a predetermined composition. Alternatively an alloy member having a thickness of about 5 mm may be manufactured by the known centrifugal casting method. A small amount of Cu, Zr, Dy, Tb, Al or Ga may be added therein during the formulation. Then the manufactured alloy member is once ground by the known hydrogen grinding process and then pulverized by the jet-mill pulverizing process.

The sintered magnet mentioned above can be manufactured by forming the ground material to a predetermined configuration such as a rectangular parallelepiped or a cylinder in a mold by using magnetic field orientation. By optimizing the conditions in each of the steps for manufacturing the sintered magnet S, the mean grain size of the sintered magnet S may be in the range of 1 μm~5 μm or in the range of 7 μm~20 μm.

If the mean grain diameter is larger than 7 μm, since the spinning force of the grains during generation of the magnetic field is increased, the degree of orientation is improved and additionally the surface area of grain boundaries is reduced, it is possible to efficiently diffuse Dy, Tb and the like, thereby obtaining a permanent magnet M having a remarkably high coercive force. If the mean grain diameter is larger than 25 μm, the rate in the grain boundary of grains including different grain orientation in one grain is extremely increased and the degree of orientation is deteriorated and, as a result, the maximum energy product, remanent flux density and the coercive force are reduced, respectively.

On the other hand if the mean grain diameter is smaller than 5 μm, the rate of single domain grains is increased and, as a result, a permanent magnet having very high coercive force can be obtained. If the mean grain diameter is smaller than 1 μm, since the grain boundary becomes small and complicated, the time required for performing the diffusing process must be extremely extended and thus the productivity is worsened.

As shown in FIG. 2, a vacuum vapor processing apparatus 1 has a vacuum chamber 12 in which a pressure can be reduced and kept at a predetermined pressure (e.g. $1 \times 10^{-5}$ Pa) via an evacuating means 11 such as turbo-molecular pump, cryopump, diffusion pump, and the like. There disposed in the vacuum chamber 12 a box body 13 comprising a rectangular parallelepiped box part 13a having an open top and a lid part 13b detachably mounted on the open top of the box part 13a.

A downwardly bent flange 131 is formed over the entire circumference of the lid part 13b. When the lid part 13b is mounted in position on the upper surface of the box part 13a, the flange 131 is fit into the outer wall of the box part 13a (in this case, no vacuum seal is provided such as a metal seal), so that a processing chamber 130 is defined which is isolated from the vacuum chamber 12. It is so arranged that, when the vacuum chamber 12 is reduced in pressure via the evacuating means 11 to a predetermined pressure (e.g. $1 \times 10^{-5}$ Pa), the processing chamber 130 is reduced in pressure to a pressure (e.g. $5 \times 10^{-4}$ Pa) that is higher substantially by half a digit than that in the vacuum chamber 12.

The volume of the processing chamber 130 is determined so that the metal atoms can be supplied onto the sintered magnet S directly or from a plurality of directions by repeating several collisions, in consideration of the average free stokes of evaporated metal material V. The box part 13a and the lid part 13b are set in wall thicknesses so as not to be deformed when heated by the heating means to be described hereinafter, and are made of a material that does not react with the metal evaporating material V.

In other words, in case $Al_2O_3$ which is often used in an ordinary vacuum apparatus is used when the metal evaporating material V is an alloy of Dy and Tb, there is a possibility that Dy and Nd in the vapor atmosphere would react with $Al_2O_3$ and form products of reaction on the surface, resulting in easy breakage of the box body 13. Accordingly the box body 2 is made, e.g., of Mo, W, V, Ta or these alloys (including rare earth elements added Mo alloy Ti added Mo alloy and the like), CaO, $Y_2O_3$ or oxides of rare earth elements or structured by heat insulation member on which said elements or alloys are coated as inner lining. A bearing grid 132 for example of plurality of Mo wires (e.g. 0.1 mm~10 mmφ) is arranged at a predetermined height from the bottom surface in the processing chamber 130 on which a plurality of sintered magnets S can be placed side by side. On the other hand, the metal evaporating materials V are appropriately placed on a bottom surface, side surfaces or a top surface of the processing chamber 130.

As the metal evaporating material there is used one which contains: at least one of Dy and Tb which largely improve the grain magnetic anisotropy of principal phase; and at least one of Nd and Pr (in this case, there may be used didymium which is an alloy of Nd and Pr). The evaporating material V is mixed at a predetermined mixing ratio and by using, e.g., an electric arc furnace an alloy in bulk form is obtained and is placed in a predetermined position in the processing chamber 130. It may also be so arranged that Dy, Tb in bulk form or in granular form or their alloy or Nd, Pr or their alloy are separately disposed in the processing chamber 130 at a predetermined weight ratio.

According to this arrangement, in addition to the fact that, at the time of diffusion into the grain boundary phases, Dy (Tb) is replaced by Nd (Pr) of grain particles to thereby improve the crystalline magnetic anisotropy the strain and defects in the grain boundaries are repaired, whereby a still higher coercivity can be possessed. In addition, since Nd and the like take the spin orientation, unlike Dy and Tb, in the same orientation as Fe, thereby resulting in a higher remanent flux density and maximum energy product. As a result, there can be obtained a permanent magnet that is still higher in magnetic properties than the conventional one. On the other hand, since the eutectic point of Nd—Fe is lower (lower by about 200° C.) than the eutectic point of Dy—Fe or Tb—Fe, the diffusion velocity of Dy, Tb in the grain boundaries becomes higher and, as a result, the diffusion step can be performed at a short time, thereby attaining a high productivity. In this case, if the metal evaporating material V contains at least one of Nd and Pr, the coercive force of the permanent magnet M can be increased, irrespective of the mixing ratio (wt %), as compared with the case in which at least one of Dy and Tb is made the metal evaporating material V.

Preferably the metal evaporating material includes at least one material of the group consisting of Al, Cu, and Ga. According to this arrangement, due to pluralistic eutectic effect, the melting point of Nd-rich phase lowers. The diffusion velocity of metal atoms of Dy and Tb further increases. In other words, in the diffusion process, elements of Al, Cu and Ga find their way into the Nd-rich phase to thereby form a complicated eutectic of Dy(Tb)—Nd(Pr)—Fe—Al (Cu, Ga), and the like. In this case, the eutectic point of the Nd-rich phase which is near the grain articles is lower in case of the polytopic systems as compared with the eutectic point of the binary system of Dy—Fe(Tb—Fe). Therefore, the diffusion velocity of the metal atoms of Dy, Tb becomes still faster. In addition, at the time of diffusion process, due to the cleaning effect as a result of operation of the above-described elements for the grain particles, and due to an increase in the effective rare earths amount due to the reduction of the rare earth oxides as a result of preferential oxidation of the above-described elements, there can be obtained a permanent magnet that has a still higher coercivity. In this case, as a result of positive reaction with harmful elements such as C which is the cause for the lowering in coercivity the effect of detriment can be lowered.

In order to obtain the same effects as the one described above, the metal evaporating material V may further comprise at least one material of the group consisting of Ag, B, Ba, Be, C, Ca, Ce, Co, Cr, Cs, Er, Eu, Fe, Gd, Ge, Hf, Ho, In, K, La, Li, Lu, Mg, Mn, Mo, Na, Nb, Ni, P, Pd, Ru, S, Sb, Si, Sm, Sn, Sr, Ta, Ti, Tm, V, W, Y, Yb, Zn, and Zr (hereinafter referred to as "element A").

A heating means 14 is arranged in the vacuum chamber 12. The heating means 14 is made of a material that does not react with the metal evaporating material V, in the same manner as with the box body 13, and is arranged so as to enclose the circumference of the box body 13. The heating means 14 is made up of a thermal insulating material of Mo make which is provided with a reflecting surface on the inner surface thereof, and an electric heater which is disposed on the inner side thereof and has a filament of Mo make. By heating the box body 13 by the heating means 14 at a reduced pressure, the processing chamber 130 is indirectly heated through the box body 13, whereby the inside of the processing chamber 130 can be heated substantially uniformly.

Then a description will be made of the manufacture of a permanent magnet M using the above-described vacuum processing apparatus 1 by performing the method of this invention. First of all, sintered magnets S made in accordance with the method described above are placed on the bearing grid 132 of the box part 13a, and an alloy of Dy and Nd to form the metal evaporating materials V is placed on the bottom surface of the box part 13a (thus the sintered magnets S and the metal evaporating materials V are disposed away from each other in the processing chamber 130). After having mounted in position the lid part 13b on the open upper surface of the box part 13a, the box body 13 is placed in a predetermined position enclosed by the heating means 14 in the vacuum chamber 12 (see FIG. 2). Then through the evacuating means 11 the vacuum chamber 12 is evacuated until it reaches a predetermined pressure (e.g. $1 \times 10^{-4}$ Pa) (the processing chamber 130 is evacuated to a pressure substantially half-digit higher than $1 \times 10^{-4}$ Pa) and the processing chamber 130 is heated by operating the heating means 14 when the vacuum chamber 12 has reached a predetermined pressure.

When the temperature in the processing chamber 130 has reached a predetermined temperature under the reduced pressure, the metal evaporating material V placed on the bottom surface of the processing chamber 130 is heated to the substantially same temperature as the processing chamber 130, and starts evaporation, and accordingly a metal vapor atmosphere is formed inside the processing chamber 130. Since the sintered magnets S and metal evaporating material V are disposed at a distance from each other, when evaporation starts, the metal evaporating material V will not be directly adhered to the sintered magnet S whose surface Nd-rich phase is melted. The metal atoms of Dy(Tb) or Nd(Pr) in the metal vapor atmosphere are supplied and adhered to the surface of sintered magnet S heated to a temperature substantially the same as that of the metal evaporating material, and the adhered metal atoms are diffused into the grain boundary phases of the sintered magnet S, thereby obtaining a permanent magnet M.

As shown in FIG. 3, in case a film-forming step and a diffusing step are performed at the same time, when metal atoms of Dy and Nd in the metal vapor atmosphere are supplied to the surface of the sintered magnet S so that a layer (thin film) L1 containing Dy and Nd can be formed, Nd deposited on the surface of the sintered magnet S as recrystallized will extremely deteriorate the surface of the permanent magnet M (surface roughness becomes worsened). In addition, Dy deposited on the surface of sintered magnet S that has been heated to substantially the same temperature during the processing is melted and excessively diffused into the grains in a region R1 near the surface of the sintered magnet S, and thus the magnetic properties cannot be effectively improved or recovered.

That is, if a thin film containing Dy and Nd is once formed on the surface of the sintered magnet S, the average composition on the surface of the sintered magnet S becomes Dy-rich composition. Once the Dy-rich composition is formed, the liquid phase temperature lowers and the surface of the sintered magnet S becomes melted (i.e. the principal phase is melted and the amount of liquid phase increases). As a result, the region near the surface of the sintered magnet S is melted and collapsed and thus the asperities increase. In addition, Dy excessively penetrates into the grains together with a large amount of liquid phase and thus the maximum energy product exhibiting the magnetic properties and the remanent flux density are further worsened.

According to the example of the present invention, metal evaporating material V in bulk form (substantially spherical shape) having a small surface area per unit volume (specific surface area) is disposed on the bottom surface of the processing chamber 130 in a ratio of 1~10% by weight of the sintered magnet so as to reduce the amount of evaporation at a constant temperature. In addition, when the metal evaporating material V is Dy and Nd, the temperature in the processing chamber 130 is arranged to be set to a range of 800° C.~1050° C., preferably 900° C.~1000° C. by controlling the heating means 14 (e.g. the saturated vapor pressure of Dy is about $1\times10^{-2}$~$1\times10^{-1}$ Pa when the temperature in the processing chamber is 900° C.

If the temperature in the processing chamber 130 (accordingly the heating temperature of sintered magnet S) is lower than 800° C., the velocity of diffusion of Dy atoms adhered to the surface of the sintered magnet S into the grain boundary phases is decreased and thus it is impossible to make the Dy atoms to be diffused and homogeneously penetrated into the grain boundary phases of the sintered magnet before the thin film is formed on the surface of sintered magnet S. On the other hand, at the temperature exceeding 1050° C., the vapor pressure increases and thus metal atoms in the vapor atmosphere are excessively supplied to the surface of the sintered magnet S. In addition, there is a possibility that Dy would be diffused into the grains. Should Dy be diffused into the grains, the magnetization in the grains is greatly reduced and, therefore, the maximum energy product and the remanent flux density are further reduced.

In order to diffuse Dy and Nd into the grain boundary phases before the thin film containing Dy and Nd is formed on the surface of the sintered magnet S, the ratio of a total surface area of the metal evaporating material V disposed on the bottom surface of the processing chamber 130 to a total surface area of the sintered magnet S disposed on the bearing grid 132 in the processing chamber 130 is set to be in a range of $1\times10^{-4}$~$2\times10^{3}$. In a ratio other than the region of $1\times10^{-4}$~$2\times10^{3}$, there are cases where a predetermined thin film is formed on the surface of the sintered magnet S and thus a permanent magnet having high magnetic properties cannot be obtained. In this case, the above-described ratio shall preferably fall within a range of $1\times10^{-3}$~$1\times10^{3}$, and the above-described ratio of $1\times10^{-2}$~$1\times10^{2}$ is more preferable.

According to the above arrangement, as a result of a combined effect of the fact: that the amount of supply of metal atoms to the sintered magnet S is restrained by lowering the vapor pressure and the amount of evaporation of the metal evaporating material V is reduced; that the diffusion velocity becomes higher by heating the sintered magnet S at a predetermined temperature range while arranging the average grain diameter of the sintered magnet S within a predetermined range, and by adding at least one of Nd and Pr to Dy(Tb) as the metal evaporating material V, the Dy atoms adhered to the surface of the sintered magnet S can be efficiently diffused into the grain boundary phases of the sintered magnet S before a thin film is formed on the surface of the sintered magnet S (see FIG. 1). As a result, the permanent magnet M can be prevented form deteriorating on the surface thereof, and the Dy can be restrained from being excessively diffused into the grain boundaries near the surface of the sintered magnet. In this manner, by having a Dy-rich phase (a phase containing Dy in the range of 5~80%) in the grain boundary phases and by diffusing Dy only in the neighborhood of the grains, the magnetization and coercive force are effectively improved or recovered. In addition, there can be obtained a permanent magnet M that requires no finishing work and that is superior in productivity.

When the sintered magnet S is formed, after having been manufactured, to a desired configuration by wire cutting as shown in FIG. 4, the magnetic properties of the sintered magnet would be sometimes extremely deteriorated due to generation of cracks in grains in the principal phase of the surface of the sintered magnet (see FIG. 4(a)). However since the Dy-rich phase is formed on the inside of the cracks of grains near the surface of the sintered magnet by performing the vacuum vapor processing (see FIG. 4(b)), the magnetizing properties and coercive force are recovered.

Cobalt (Co) has been added in the neodymium magnet of the prior art as a measure to prevent corrosion of the magnet. However, according to the present invention, since Dy-rich phase having extremely high corrosion resistance and atmospheric corrosion resistance as compared with Nd exists on the inside of cracks of grains near the surface of the sintered magnet and in the grain boundary phases, it is possible to obtain a permanent magnet having extremely high corrosion resistance and atmospheric corrosion resistance without using Co. Furthermore, in case Dy (Tb) that has been adhered to the surface of the sintered magnet is diffused, since there is no intermetallic compound containing Co in the grain boundary phases of the sintered magnet S, the metal atoms of Dy and Tb adhered to the surface of the sintered magnet S are further efficiently diffused.

Finally after having performed the above-described process for a predetermined period of time (e.g. 4~48 hours), the operation of the heating means 14 is stopped, Ar gas of 10 KPa is introduced into the processing chamber 130 through a gas introducing means (not illustrated), evaporation of the metal evaporating material V is stopped, and the temperature in the processing chamber 130 is once lowered to 500° C. Continuously the heating means 14 is operated again, the temperature in the processing chamber 130 is set to a range of 450° C.~650° C., and heat treatment for removing the strains in the permanent magnet is carried out to further improve or recover the coercive force. Finally the vacuum chamber 12 is rapidly cooled substantially to room temperature and the box body 13 is taken out of the vacuum chamber 12.

In the example of the present invention, although it has been described that an alloy of Dy and Nd is used as a metal evaporating material V. However, there may be used an alloy containing Tb with a low vapor pressure and at least one of Nd and Pr in a range of heating temperature (900° C.~1000° C.). Or else, an alloy containing both Dy and Tb and at least one of Nd and Pr may also be used. It is so arranged that there is used a metal evaporating material V in bulk form and having a small specific surface area in order to reduce the amount of evaporation at a certain temperature. However, without being limited thereto, it may be so arranged that a pan having a recessed shape in cross section is disposed inside the box part 13a to contain in the pan the metal evaporating material V in granular form or bulk form to thereby reduce the specific surface area. In addition, after having contained the metal evaporating material inside the pan, a lid (not illustrated) having a plurality of openings may be mounted.

In the example of the present invention, it has been described that a sintered magnet S and the metal evaporating material V are disposed inside the processing chamber 130. However, in order to enable to heat the sintered magnet S and the metal evaporating material V at different temperatures, an evaporating chamber (another processing chamber, not illustrated), e.g., may be provided inside the vacuum chamber 12 aside from the processing chamber 130, and another heating means for heating the evaporating chamber is provided. It may thus be so arranged that, after having evaporated the metal evaporating material inside the vacuum chamber, the metal atoms in the vapor atmosphere can be supplied to the sintered magnet inside the processing chamber 130 through a communicating passage which communicates the processing chamber 130 and the evaporating chamber together.

In this case, in case the metal evaporating material V contains Dy the evaporating chamber may be heated to a range of 700° C.~1050° C. (at 700° C.~1050° C., the saturated vapor pressure is about $1\times10^{-4}$~$1\times10^{-1}$ Pa). At a temperature lower than 700° C., the vapor pressure cannot reach a level at which Dy can be supplied to the surface of the sintered magnet S so that Dy is diffused and homogeneously penetrated into the grain boundary phases. On the other hand, in case the metal evaporating material V contains Tb, the evaporating chamber may be heated to a range of 900° C.~1150° C. At a temperature lower than 900° C., the vapor pressure cannot reach a level at which Tb atoms can be supplied to the surface of the sintered magnet S. On the other hand, at a temperature higher than 1150° C., Tb will be diffused into grains and thus the maximum energy product and the remanent flux density will be decreased.

In order to remove soil, gas or moisture adsorbed on the surface of sintered magnet S before Dy and Tb are diffused into the grain boundary phases, it may be possible to reduce the pressure in the vacuum chamber 12 to a predetermined pressure (e.g. $1 \times 10^{-5}$ Pa) through the evacuating means 11 and to keep it at the pressure for a predetermined period of time after the pressure in the processing chamber 130 has been reduced to a pressure (e.g. $5 \times 10^{-4}$ Pa) higher substantially by half-digit than the pressure in the vacuum chamber 12. At this time, it may be possible to heat the processing chamber 130 to, e.g., 100° C. by operating the heating means 14 and to keep this temperature for a predetermined period of time.

On the other hand, it may be possible to provide a known plasma generating apparatus (not illustrated) for generating Ar or He plasma in the vacuum chamber 12 and to perform a preliminary treatment for cleaning the surface of sintered magnet S by plasma prior to a treatment in the vacuum chamber 12. In case the sintered magnet S and the metal evaporating material V are disposed in the same processing chamber 130, it may be possible to arrange a known conveyor robot in the vacuum chamber 12 and to mount the lid part 13b in the vacuum chamber 12 after the cleaning has been completed.

Further in the example of the present invention, it is described that the box part 13 is structured by a box part 13a and a lid part 13b to be mounted on the upper surface of the box part 13a. However, if the processing chamber 130 is isolated from the vacuum chamber 12 and can be reduced in pressure accompanied by the pressure reduction in the vacuum chamber 12, it is not necessary to limit to the above example. For example, after having housed the sintered magnet S into the box part 13a, the upper opening thereof may be covered by a foil of Mo make. It may be also possible to construct the processing chamber 130 so as to be tightly closed in the vacuum chamber 12 so that the processing chamber can keep a predetermined pressure independent of the vacuum chamber 12.

Further, in the above-described example, a description has been made of an example in which the permanent magnet M is manufactured in a process of performing the film-forming step and the diffusing step at the same time. Without being limited thereto, first, metal evaporating material V may be caused to be adhered to, and deposited on, the surface of the Nd—Fe—B sintered magnet S to thereby form a predetermined thin film (film-forming step) and, then by performing a heat treatment, the metal evaporating material that has been deposited on the surface may be caused to be diffused into the grain boundary phases of the sintered magnet (diffusion step), thereby manufacturing a permanent magnet.

In this case, as the film-forming apparatus to perform the film-forming step, there may be used a vapor deposition apparatus of the known construction of electric resistance heating or the one provided with an electron gun. However, in order to increase the yield of Dy and Tb which are scanty as natural resources and a stable supply thereof cannot be expected, and also in order to improve the productivity by shortening the film-forming time, it is preferable to make use of the following film-forming apparatus 10 in the film-forming step.

With reference to FIGS. 5 and 6, a film forming (film deposition) apparatus 10 is constituted by vertically connecting a processing chamber 2 and a preparatory chamber 3. The processing chamber 2 that is positioned on an upper side is disposed inside a cylindrical vacuum chamber 10b which is capable of maintaining a predetermined degree of vacuum (e.g. $10 \times 10^{-6}$ Pa) by means of an evacuating means 10a such as a turbo molecular pump, cryopump, diffusion pump, and the like.

The processing chamber 2 is defined by a cylindrical soaking plate 21 which is open on the lower surface and is communicated with the preparatory chamber 3 through the opening on the lower surface thereof. The vacuum chamber 10b is provided on its circumference with insulating material constituted by carbon except for the lower surface in which the soaking plate 21 is open. In a space between the soaking plate 21 and the insulating material 22 there are provided a plurality of electric heaters 23 using, e.g., W, which constitute heating means. According to this arrangement, it is possible to heat, by the heating means 23 in vacuum, the soaking plate 21 enclosed by the insulating material 22, and to substantially uniformly heat the treatment chamber 2 by indirectly heating the processing chamber 2 through the soaking plate 21.

The processing chamber 2 is provided inside thereof with a pan 24 with a recessed cross-section on which the metal evaporating material V is placed. The pan 24 is formed into an annular shape so that the metal evaporating material of granular or bulk form can be disposed around the sintered magnet S to be moved into the processing chamber 2 by a transporting means which is described hereinafter. The pan 24 is mounted on a wall surface on an inner side of the soaking plate 21. The pan 24 need not be formed into an annular shape, but may be disposed in the circumferential direction at an equal distance from one another. In this case, although Dy and Tb are high in melting points, by using an alloy of Nd, Pr, Al, Cu or Ga, and the like as the metal evaporating material V, the time for forming metal vapor atmosphere inside the processing chamber can be shortened.

On a lower side of the processing chamber 2 there is formed a first space 4. The first space 4 is provided with a shut-off means 5. The shut-off means 5 is made up of a valve body 51 and a driving means 52 such as an air cylinder and the like to drive the valve body 51. The shut-off means 5 is movable by the driving means 52 between an open position (the state as shown in FIG. 1) in which the valve body 51 brings the processing chamber 2 and the preparatory chamber 3 into communication with each other, and a closed position in which the valve body 51 comes into abutment with the peripheral part of an opening which is formed in a ceiling plate 41 defining the first space 4, thereby hermetically closing the processing chamber. Although not illustrated, the valve body 51 is provided with a second heating means.

On the lower side of the first space 4 there is provided a second space 3a. A gate valve (not illustrated) is provided on a side wall 30 which defines the second space 3a. Transportation into, and out of, the sintered magnet S is performed by opening and closing this gate valve. The sintered magnet S is held by a holding means 6. The holding means 6 is made up of: three supporting columns 61 which are vertically disposed on the same circle at a predetermined distance from one another; and two bearing grids 62 which are supported by each of the supporting columns 61 and provided horizontally at a predetermined distance from each other from the bottom end of the supporting columns 61 upward. Each of the supporting columns 61 is constituted into a small diameter so as to minimize the conduction of heat. This is to make it difficult for the heat from a pressing member 74, described hereinafter, to be transferred to the sintered magnet S through the supporting columns 61.

In order to enable film forming on the sintered magnet S also to the surface lying on the side of the bearing grid 62 on which is mounted the sintered magnet S, the bearing grid 62 is preferably disposed by arranging wires of φ0.1~10 mm in lattice form. The distance between the bearing grids 62 is set considering the height and the like of the sintered magnet S. The holding means 6 is disposed on a circular disk 63 which is provided in the second space 3*a* and which has in the center thereof an opening 63*a* through which a supporting table described later can pass. The disk 63 is disposed on a ring-shaped supporting member 64 which is provided in the processing chamber 2.

The material of the soaking plate 21 for defining the processing chamber 2 is, like the above, manufactured by a material that does not react with the metal evaporating material, such as Mo, W, V, Ta or an alloy thereof (including rare earth elements added Mo alloy Ti added Mo alloy etc.), CaO, $Y_2O_3$ or oxides of rare earth elements, or constituted by forming a film of these materials as an inner lining on the surface of other heat insulation members.

On a lower side of the second space 3*a* there is formed a third space 3*b*. The second space 3*a* and 3*b* constitute the preparatory chamber 3. To the preparatory chamber 3 there is connected an evacuating means 31 such as a turbo molecular pump, cryo-pump, diffusion pump, and the like. By means of the evacuating means 31 the preparatory chamber 3 and the processing chamber 2 which is communicated with the preparatory chamber 3 through the first space 4 can be kept to a predetermined degree of vacuum. At the bottom of the preparatory chamber 3 there is provided a driving means 71 such as an air cylinder, and the like. To the front end of a shaft portion 72 that is projected into the preparatory chamber 3, there is attached a circular support 73. The driving means 71 and the support 73 constitute the transportation means 7. The support 73 is made movable between a predetermined position (lowered position) inside the preparatory chamber 3 and a predetermined position (lifted position) inside the processing chamber 2.

The shaft portion 72 has attached thereto a pressing member 74 of T-shape in cross-section so as to be positioned on the lower side of the support 73. The pressing member 74 serves the purpose of lifting the disk 63 when the transporting means 7 is moved to the lifted position to thereby urge a sealing member (not illustrated) such as metal seal, and the like which is provided at the peripheral portion of the disk 63, against the peripheral portion of the opening formed in the ceiling plate 41. The pressing means 74 is provided with a third heating means (not illustrated).

The second space 3*a* which constitutes the preparatory chamber 3 is provided with a plasma generating means having: a coil (not illustrated) which is connected to a radio-frequency source, and a gas introduction means 32 for introducing inert gases. The inert gas may be rare gas such as He, Ar, and the like. Plasma is generated in the preparatory chamber 3 to perform preparatory processing by plasma in the form of cleaning of the surface of the sintered magnet S prior to the film-forming in the preparatory chamber 2. In this case, an electric heater (not illustrated) using, e.g., W may be disposed in the preparatory chamber 3 so that, together with the preparatory processing of cleaning the surface of the sintered magnet S by heat treatment, heat treatment may be performed in vacuum atmosphere on the sintered magnet S which has finished film forming.

A description will now be made of film forming of metal evaporating material V using the above-described film forming apparatus 1. First, the Nd—Fe—B sintered magnet S manufactured as described hereinabove is placed on the bearing grid 61 of the holding means 6. In doing so, it is preferable to place it so that the easy axis of magnetization is parallel to the support 73. Then, the metal evaporating material V which is made of an alloy e.g., of Dy and Nd is placed on the pan 24 inside the processing chamber 3. In order to improve the yield, the total amount of the metal evaporating material V to be placed on the pan 24 shall be limited to an amount required to keep the Dy vapor atmosphere inside the processing chamber 2 until the sintered magnet S reaches a predetermined temperature (the temperature at which Dy (Tb) is diffused not only into the grains of the sintered magnet but also into the grain boundary phases).

Then, the gate valve disposed on the side wall 30 is opened to transport the holding means 6 on which the sintered magnet is placed, into the second space 3*a* and place it on the disk 63*a*. Then, the gate valve is closed and each of the evacuating means 11, 31 is operated to thereby evacuate the vacuum chamber 12 and, also evacuate the preparatory chamber 3 as well as the processing chamber 2 through the first space 4 until they reach a predetermined pressure (e.g., $10 \times 10^{-6}$ Pa). In this case, the shut-off means 5 is in the "open" position.

Then, once the pressure in the processing chamber 2 and the preparatory chamber 3 has reached the predetermined value, the shut-off means 5 is moved to the "closed" position by the driving means 52 to thereby hermetically seal the processing chamber 2 by the valve body 51. By operating the heating means 23 and the second heating means in the valve body 51 in the shut-off means 5, heating is continued until the temperature inside the processing chamber 2 reaches a predetermined temperature. It is preferable to set the temperature in the processing chamber 2 to a range of 1000° C.~1700° C. At the temperature below 1000° C., the vapor pressure is not attained at which the film of the metal evaporating material V can be successfully formed on the surface of the sintered magnet S at a high speed. At the temperature exceeding 1700° C., on the other hand, the time of film formation of the sintered magnet S becomes too short, with the result that a uniform film formation cannot be made. The processing chamber 2 shall preferably be kept to a temperature range of 1200° C.~1500° C., more preferably of 1200° C.~1400° C. In these temperature ranges films of desirable film thickness can be formed at a high speed. Then, a metal evaporating atmosphere having a vapor pressure of 10 Pa at, e.g., 1300° C. is formed inside the processing chamber 2. Since convection takes place inside the processing chamber 2 at 10 Pa, film can be formed over the entire surface of the sintered magnet S that is at room temperature when taken into the processing chamber.

On the other hand, while the metal evaporating atmosphere is being formed in the processing chamber 2, the preprocessing work of cleaning the surface of the sintered magnet S is carried out in the preparatory chamber 3. That is, after the preparatory chamber 2 (in this case, this chamber constitutes a processing chamber for preprocessing) has reached a predetermined pressure ($10 \times 10^{-6}$ Pa), that state is kept for a predetermined period of time. According to this arrangement, stains, gases and moisture adsorbed on the surface of the sintered magnet can be removed. In this case, in order to accelerate the removal of the gases and moisture adsorbed on the surface, the preparatory chamber may be heated to a predetermined temperature (100° C.) and keep it thereat. Further, in order to remove oxide films on the surface of the sintered magnet S, prior to heating of the preparatory chamber in which the sintered magnet has been placed, cleaning of the surface of the sintered magnet by means of plasma may be performed. In this case, until the pressure in the preparatory chamber 3 reaches a predetermined value (e.g., $10\times10^{-1}$ Pa), it may be so arranged that inert gas such as Ar is introduced into the preparatory chamber 3 through the gas introduction means 32, and that the radio frequency source is operated to generate plasma inside the preparatory chamber 3, thereby performing the cleaning by plasma of the surface of the sintered magnet. When the preparatory processing in the form of cleaning has finished, the sintered magnet will be at a temperature between room temperature ~200° C.

Then, once the formation of metal evaporating atmosphere in the processing chamber 2 and the cleaning of the surface of the sintered magnet S in the preparatory chamber 3 have been finished, inert gas such as Ar is introduced into the preparatory chamber 3 through the gas introduction means 32 until the pressure in the preparatory chamber 3 reaches a predetermined value (e.g., 1000 Pa) so that the two-digit pressure difference or more occurs as compared with the processing chamber 2. Once the pressure in the preparatory chamber 3 has reached the predetermined value, the shut-off means 5 is moved to the "open" position to thereby bring the processing chamber 2 into communication with the preparatory chamber 3. In this case, since there is maintained a pressure difference between the processing chamber 2 and the preparatory chamber 2, Ar will flow from the preparatory chamber 3 into the processing chamber 2, whereby the pressure in the processing chamber 2 will increase. Although evaporation will stop once (the operation of the heating means 23 does not stop), the metal atoms of Dy and Nd as evaporated in the processing chamber 2 are prevented from entering toward the preparatory chamber 3.

Thereafter, when evacuation is performed until the pressure in the processing chamber 2 and the preparatory chamber 3 attains again a predetermined value (e.g., $10\times10^{-2}$ Pa), evaporation takes place again. Then, the driving means 71 of the transport means 7 is operated so that the holding means 6 having held the sintered magnet S is transported into the processing chamber 2. In this case, the processing chamber 2 is hermetically sealed because the sealing member such as the metal seal disposed in the peripheral portion of the disk 63 comes into abutment with the peripheral portion of the opening formed in the ceiling plate 41.

Thereafter, when the heated processing chamber 2 is hermetically sealed once again, saturated vapor atmosphere of, e.g., 10 Pa at 1300° C. will be formed inside the processing chamber 2, and this state is held for a predetermined period of time. In this case, since the sintered magnet S that is lower than the temperature in the processing chamber 3 is transported into the high-temperature processing chamber 2, the metal atoms of Dy and Nd in the vapor atmosphere will be selectively adhered to, and deposited on, the surface of the sintered magnet S (film-forming or film deposition process). According to the above operations, film of the metal atoms is formed at a high speed only on the surface of the sintered magnet S. At this time, since the pressing member 74 of the support 73 has been heated to substantially the same temperature as that of the soaking plate 21 by the third heating means (not illustrated), there is no possibility that the metal atoms in the vapor atmosphere get adhered to the pressing member 74.

When the sintered magnet S at room temperature is transported into the processing chamber 2 that is heated to a high temperature, the sintered magnet S itself will also be heated by the heat of radiation. Therefore, the time of retention thereof in the processing chamber 2 where the saturated vapor atmosphere has been formed is the time for the sintered magnet S to reach about 1000° C., and shall be the time until the required amount of metal atoms are adhered to, and deposited on, the surface of the sintered magnet S ("required amount" means the amount in which Dy is diffused only into the grain boundary phases to thereby improve the magnetic properties of the sintered magnet). Once the sintered magnet S reaches the temperature exceeding 1000° C., Dy will penetrate into the grain (grain boundary as principal phase) of the sintered magnet S and, finally will be equal to something in which Dy is added to obtain a permanent magnet. There is therefore a possibility that the magnetic field strength and, accordingly the maximum energy product exhibiting the magnetic properties will be largely reduced.

In case the sintered magnet S is heated and thermally expanded, the thermal expansion of the sintered magnet S will show abnormality like invar alloy below the Curie temperature (about 300° C.), and the film adhered to, and deposited on, the surface of the sintered magnet S is likely to be peeled off. Therefore, the time of retention shall preferably be limited to the time at which the maximum temperature of the sintered magnet S becomes 250° C. or less or above 450° C. At a temperature below 250° C. the strain due to abnormality by thermal expansion becomes small and, accordingly the peeling of Dy or Nd that has been formed into a film on the surface of the sintered magnet S is hard to occur. On the other hand, at a temperature above 450° C., the sintered magnet S partly gets melted and, accordingly the adhesiveness between the sintered magnet S and Dy and Nd that has been adhered to, and deposited on, the surface of the sintered magnet S improves. As a result, the peeling of Dy and Nd that has been formed into a film on the surface of the sintered magnet S becomes less likely to occur.

On the other hand, inert gas such as Ar and the like is introduced into the preparatory chamber 3 until the pressure in the preparatory chamber 3 reaches a predetermined value (e.g., 1000 Pa) through the gas introduction means 32. After the lapse of a predetermined time after the sintered magnet S has been transferred into the processing chamber 2, the support 73 is moved by the driving means 71 from the lifted position inside the processing chamber 2 to the lowered position inside the preparatory chamber 3, and the shut-off means 5 is moved from the "open" position to the "closed" position. At this time, since the valve body 51 has been heated by the second heating means (not illustrated) to substantially the same temperature as the soaking plate 21, there is no possibility that the metal atoms in the vapor atmosphere get adhered to the valve body 51. In addition, evaporation stops as a result of entering of Ar from the preparatory chamber 3 into the processing chamber 2. The sintered magnet on which a film of predetermined metal has been formed is cooled in the Ar atmosphere.

Then, diffusion process is performed in the preparatory chamber 3. That is, the pressure in the preparatory chamber 3 that is isolated from the processing chamber 2 is evacuated by the evacuation means 31 until it reaches a predetermined value ($10\times10^{-3}$ Pa). The heating means provided in the preparatory chamber 3 is operated, and heat treatment is performed on the sintered magnet S on which a film of Dy and Nd has been formed for a predetermined period of time at a predetermined temperature (e.g., 700° C.~950° C.) (diffusion process). In this case, subsequent to the heat treatment in the preparatory chamber 3, heat treatment shall preferably be performed to remove the strain of the permanent magnet for a predetermined period of time (e.g., for 30 minutes) at a predetermined temperature (e.g., 500° C.~600° C.) that is lower than that in the preceding heat treatment in the preparatory chamber 3 (annealing process).

The film thickness of the metal evaporating material at the film-forming process is determined considering the heat treatment time, volume of the sintered magnet S, and the like at the diffusion process (e.g., 2~20 μm). In this case, it is not necessary to adhere and deposit the metal atoms over the entire surface of the sintered magnet S. If metal atoms are present in at least part of the surface, a high-performance permanent magnet M can be obtained by diffusing Dy (Tb) into the grain boundary phases at the diffusion process. It is, however, to be noted that, when the surface area of having formed the film of Dy (Tb) is small as compared with the volume of the sintered magnet, the time for heat treatment becomes long at the diffusion process. Therefore, when the productivity is taken into consideration, it is preferable that metal atoms are adhered to, or deposited on, at least 80% of the total surface area of the sintered magnet S. Finally after cooling for a predetermined period of time, the gate valve on the side wall 30 is opened and the holding means 6 is taken out.

According to the above arrangement, there can be obtained a permanent magnet in which a film of metal evaporating material V has been formed over the entire surface of the sintered magnet S and, after heat treatment, in which a diffusion layer of Dy (Tb) has been formed on at least part of the surface of the sintered magnet S, and in which Dy (Tb) has been diffused into the grain boundary phases. In this case, due to the fact that an additional surface treatment process can be omitted, that a thin film including Dy and Nd can be formed to a predetermined thickness on the surface of the sintered magnet S at a high speed, and further that the productivity can be improved further, resulting in a high yield of Dy and Tb, and further reduction in cost is possible.

Example 1

As a Nd—Fe—B sintered magnet, a member machined to a plate (40×10×5 (thickness) mm) having a composition of 28Nd-1B-0.1Cu-1Co-bal. Fe, $O_2$ content of the sintered magnet S itself of 500 ppm, and average grain diameter of 3 μm was used. In this example, the surface of the sintered magnet S was finished to have the surface roughness of 10 μm or less and then washed by acetone.

Then a permanent magnet M was obtained by the above-described vacuum vapor processing using the above-described vacuum vapor processing apparatus 1. In this case, as the box body 13 there was used one of Mo make having dimensions of 200×170×60 mm. One-hundred twenty (120) sintered magnets S were placed on the bearing grid 132 at an equal distance to one another. Further, as the metal evaporating material V, Dy and Nd of 99.9% degree in purity were mixed in a predetermined mixing ratio, an alloy of bulk form was obtained in an electric arc melting furnace, and a total of 50 g was disposed on the bottom surface of the processing chamber 130. In addition, weighing was made to obtain 50Dy and 50didymium; 50Dy, 25Nd and 25Pr; and 50Dy and 50Pr to thereby respectively obtain an alloy of bulk form by an electric arc melting furnace, and an arrangement was made so as to be able to dispose a total of 50 g on the bottom surface of the processing chamber 130.

Then the vacuum chamber was once reduced to $1\times10^{-4}$ Pa (the pressure in the processing chamber was about $5\times10^{-3}$ Pa) by operating the evacuating means, and the temperature in the processing chamber 130 to be heated by the heating means 14 was set at 900° C. The vacuum vapor processing was performed for 6 hours in this state after the temperature in the processing chamber 130 had reached 900° C. Then, heat treatment for removing the strain in the permanent magnet was performed. In this case, the processing temperature was set to 530° C. and the processing time was set to 90 minutes. Thereafter, the permanent magnet was cut by wire-cutting into a cylindrical configuration of ϕ10×5 mm.

FIG. 7 is a table showing average values of magnetic properties of permanent magnets when the permanent magnet is obtained, together with average values of magnetic properties of the permanent magnet when the permanent magnet was obtained by setting the time of vacuum vapor processing to 12 hours (Comparative Example 1a) and 6 hours (Comparative Example 1b) respectively by using Dy in bulk form of 99.9% degree of purity as the magnet evaporating material V. According to this, in the comparative examples, when the vacuum vapor processing time becomes longer, the coercive force becomes high; in the Comparative Example 1a, the coercive force was about 20 kOe. On the other hand, in Example 1, in case the metal evaporating material V is an alloy of Dy and Nd, the coercive force is about 24.5 kOe even if Nd is mixed in the ratio of 99 wt %. It can thus be found that the permanent magnet in question has a higher coercive force than those in the Comparative Examples 1a, 1b and that a permanent magnet of high magnetic properties can be obtained. In addition, in case an alloy having mixed Nd and Pr to Dy was used as the metal evaporating material V, the coercive force was above about 27 kOe and can thus obtain a permanent magnet having a high coercive force and high magnetic properties. Further, even in case an alloy having mixed only Pr to Nd was used, it can be found that a permanent magnet of high magnetic properties having a coercive force of 28.5 kOe can be obtained.

Example 2

As a Nd—Fe—B sintered magnet, a member machined to a plate (40×10×5 (thickness) mm) having a composition of 28Nd-1B-0.1Cu-1Co-bal. Fe, $O_2$ content of the sintered magnet S itself of 500 ppm, and average grain diameter of 3 μm was used. In this example, the surface of the sintered magnet S was finished so as to have a surface roughness of 10 μm or less and then washed by acetone.

Then, a permanent magnet M was obtained using the vacuum vapor processing apparatus 1 and the vacuum vapor processing method described above. In this example, as a box body 13, the one of Mo make having dimensions of 200×170× 60 mm was used. And 120 sintered magnets S are placed at an equal distance to one another on the bearing grid 132. In addition, as the metal evaporating material V, an alloy of bulk form was obtained by an electric arc melting furnace by combining 99.9% degree of purity of Tb and Nd in a predetermined mixing ratio, and the obtained alloy of 1000 g in total was disposed on the bottom surface of the processing chamber 130. In addition, weighing was made to obtain 50 Tb and 50 didymium; 50 Tb, 25 Nd and 25 Pr; and 50 Tb and 50 Pr. Alloy in bulk form was respectively obtained in an electric arc melting furnace and 1000 g in total was arranged to be disposed on the bottom surface of the processing chamber 130.

Then the vacuum chamber was once reduced to $1\times10^{-4}$ Pa (the pressure in the processing chamber was $5\times10^{-3}$ Pa) by operating the evacuating means, and the temperature of the processing chamber 130 heated by the heating means 14 was set at 1025° C. and the above-described processing was performed for 4 hours after the temperature in the processing chamber 130 had reached 1025° C. Then heat treatment was performed to remove the strain in the permanent magnet. In this case, the treating temperature was set at 530° C. and the treating time at 90 minutes. Finally the permanent magnet was cut by wire-cutting into a cylindrical configuration of $\phi$10 mm×5 mm.

FIG. 8 is a table in which an average value of magnetic properties when the permanent magnet was obtained as above is shown together with an average value of magnetic properties when the permanent magnet was obtained by using the metal evaporating material of Tb of bulk form of 99.9% degree of purity and vacuum vapor processing time was set to 12 hours (Comparative Example 2a) and 4 hours (Comparative Example 2b), respectively. According to the above, in the comparative examples, the longer becomes the vacuum vapor processing time, the higher becomes the coercive force. In the Comparative Example 2a, the coercive force was about 21 kOe. On the other hand, in the Example 2, in case the metal evaporating material V was an alloy of Tb and Nd, the coercive force was about 28.5 kOe even in case 90% by weight of Nd was mixed. It can thus be found that there can be obtained a permanent magnet of high magnetic properties that has a higher coercive force than those of the Comparative Examples 2a, 2b. In case an alloy obtained by mixing Nd and Pr with Tb was used as the metal evaporating material V, it can be found that there can be obtained a permanent magnet of high magnetic properties that has a coercive force of 31 kOe which is higher than those in Comparative Examples 2a, 2b and, even in case an alloy obtained by mixing only Pr with Tb was used, it can be found that a permanent magnet of high magnetic properties with coercive force of 33 kOe was obtained.

Example 3

As a Nd—Fe—B sintered magnet, a member machined to a shape of 40×10×8 (thickness) mm having a composition of 20Nd-1B-5Pr-3Dy-bal. Fe, content of the sintered magnet S itself of 500 ppm, and average grain diameter of 3 μm was used. In this case, the surface of the sintered magnet S was finished so as to have a surface roughness of 50 μm or less and then washed by nitric acid.

Then a permanent magnet M was obtained using the vacuum vapor processing apparatus 1 and the vacuum vapor processing method described above. In this case, as a box body 13, the one of Mo—Y make having dimensions of 200×170×60 mm was used. And 60 sintered magnets S were placed at an equal distance to one another on the bearing grid 132. In addition, as the metal evaporating material V, an alloy of bulk form was obtained by an electric arc melting furnace by weighing to have 90 Dy and Nd and thereafter mixing element A in a predetermined mixing ratio. The obtained alloy of 30 g in total was disposed on the bottom surface of the processing chamber 130.

Then, the vacuum chamber was once reduced in pressure to 1×10$^{-4}$ Pa (the pressure in the processing chamber was 5×10$^{-3}$ Pa) by operating the evacuating means, and the temperature of the processing chamber 20 heated by the heating means 14 was set at 850° C. When the processing chamber 130 reached the temperature of 850° C., the above-described processing was performed in this state for 16 hours. Then, heat treatment was performed for removing the strains of the permanent magnet. In this case, the processing temperature was set at 530° C., and the time of processing at 90 minutes. Thereafter, the product thus obtained was cut by a wire cuter into dimensions of $\phi$10 mm×5 mm.

FIG. 9 is a table showing together an average value of the magnetic properties of the permanent magnet obtained in the above-described Example 3 and an average value (Comparative Example 3) of magnetic properties when a permanent magnet similar to the one in Example 3 was obtained. According to this, while the coercive force was about 30 kOe in the Comparative Example 3, the coercive force of Example 3 was 33.5~38.3 kOe by mixing element A as the metal evaporating material. It can thus be found that the coercive force was further improved. In this case, if at least one material of the group consisting of Al, Cu, and Ga is mixed, the coercive force further improved.

Example 4

As a Nd—Fe—B sintered magnet, there was used one which was obtained by machining into a shape of 40×10×8 (thickness) mm with 20Nd-1B-5Pr-3Dy-bal. Fe, O$_2$ content of sintered magnet S itself of 500 ppm and average grain size of 3 μm. In this case, the surface of the sintered magnet S was machined to a surface roughness of 50 μm or less and washed with nitric acid.

Then, by using the vacuum vapor processing apparatus 1, there was obtained a permanent magnet M in the above-described vacuum vapor processing method. In this case, as a box body 13, the one of Mo—Y make having dimensions of 200×170×60 mm was used. And 60 sintered magnets S were placed at an equal distance to one another on the bearing grid 132. In addition, as the metal evaporating material V, weighing was made to have 90 Tb and 10 Nd, and element A was mixed in a predetermined mixing ratio. An alloy of bulk form was obtained by an electric arc melting furnace. The obtained alloy of 500 g in total was disposed on the bottom surface of the processing chamber 130.

Then, the vacuum chamber was once reduced to 1×10$^{-4}$ Pa (the pressure in the processing chamber was 5×10$^{-3}$ Pa) by operating the evacuating means, and the temperature of the processing chamber 130 heated by the heating means 14 was set at 950° C. The above-described processing was performed for 12 hours at this state after the temperature in the processing chamber 130 had reached 950° C. Then heat treatment was performed to remove the strain in the permanent magnet. In this case, the treating temperature was set at 530° C. and the treating time at 90 minutes. Finally the permanent magnet was cut by wire-cutting into a cylindrical configuration of 10 mm$\phi$×5 mm.

FIG. 10 is a table showing together an average value of the magnetic properties of the permanent magnet obtained in the above-described Example 4 and an average value (Comparative Example 4) of magnetic properties when a permanent magnet similar to the one in Example 3 was obtained without mixing element A. According to this, while the coercive force was about 35 kOe in the Comparative Example 4, the coercive force of Example 4 was 37.2~42.4 kOe by mixing element A as the metal evaporating material. It can thus be found that the coercive force was further improved. In this case, too, if at least one material of the group consisting of Al, Cu, and Ga is mixed, the coercive force further improved.

Example 5

In Example 5a Nd—Fe—B sintered magnet was obtained under the same conditions as in Example 3. By using the above-described vacuum vapor processing apparatus 1, a permanent magnet M was obtained by the above-described vacuum vapor processing method under the same conditions as in Example 3. However, as the metal evaporating material element A was mixed with Dy of 99.9% degree of purity in a predetermined mixing ratio. An alloy in bulk form was obtained in an electric arc melting furnace and 500 g in total of alloy was disposed on the bottom surface of the processing chamber 130.

FIG. 11 is a table showing together an average value of the magnetic properties of the permanent magnet obtained in the above-described Example 5 and an average value (Comparative Example 5) of magnetic properties when a permanent magnet similar to the one in Example 5 was obtained without mixing element A. According to this, while the coercive force was about 22 kOe in the Comparative Example 5, the coercive force of Example 5 was 24.9~29.5 kOe by mixing element A as the metal evaporating material. It can thus be found that the coercive force was further improved. In this case, if at least one material of the group consisting of Al, Cu, and Ga is mixed, the coercive force further improved.

Example 6

In Example 6a Nd—Fe—B sintered magnet was manufactured under the same conditions as in Example 4. By using the above-described vacuum vapor processing apparatus 1, a permanent magnet M was obtained by the above-described vacuum vapor processing method under the same conditions as in Example 4. However, as the metal evaporating material element A was mixed with Tb of 99.9% degree of purity in a predetermined mixing ratio. An alloy in bulk form was obtained in an electric arc melting furnace and 1000 g in total of alloy was disposed on the bottom surface of the processing chamber 130.

FIG. 12 is a table showing together an average value of the magnetic properties of the permanent magnet obtained in the above-described Example 6 and an average value (Comparative Example 6) of magnetic properties when a permanent magnet similar to the one in Example 6 was obtained without mixing element A. According to this, while the coercive force was about 24.2 kOe in the Comparative Example 6, the coercive force of Example 6 was 24.9~32.5 kOe by mixing element A as the metal evaporating material. It can thus be found that the coercive force was further improved. In this case, if at least one material of the group consisting of Al, Cu, and Ga is mixed, the coercive force further improved.

BRIEF DESCRIPTION OF THE DRAWINGS

FIG. 7 is a table showing average values of magnetic properties of the permanent magnet manufactured in accordance with Example 1;

FIG. 8 is a table showing average values of magnetic properties of the permanent magnet manufactured in accordance with Example 2;

FIG. 9 is a table showing average values of magnetic properties of the permanent magnet manufactured in accordance with Example 3;

FIG. 10 is a table showing average values of magnetic properties of the permanent magnet manufactured in accordance with Example 4;

FIG. 11 is a table showing average values of magnetic properties of the permanent magnet manufactured in accordance with Example 5; and FIG. 12 is a table showing average values of magnetic properties of the permanent magnet manufactured in accordance with Example 6.

Figure 1:
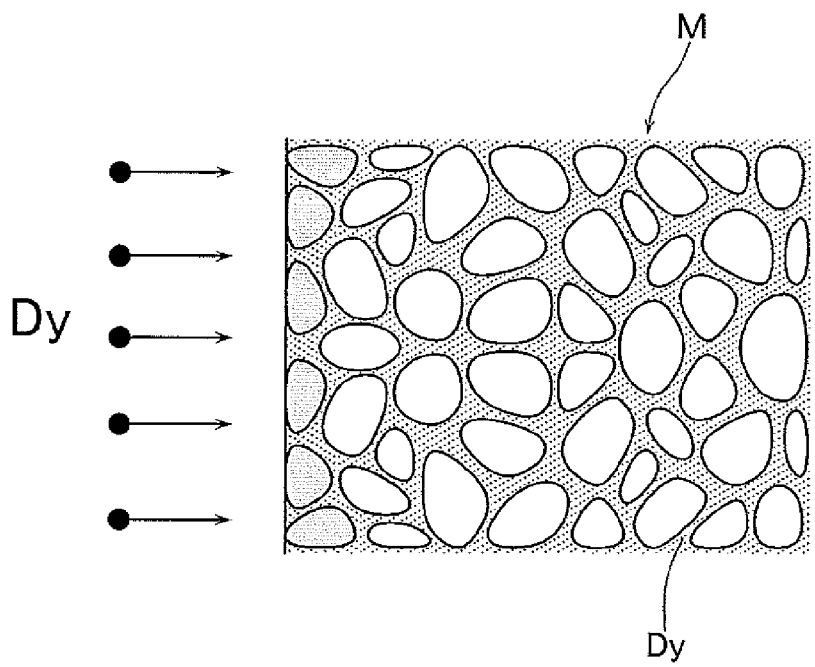
FIG. 1 is a schematic explanatory view of a cross-section of the permanent magnet manufactured in accordance with the present invention.
Figure 2:
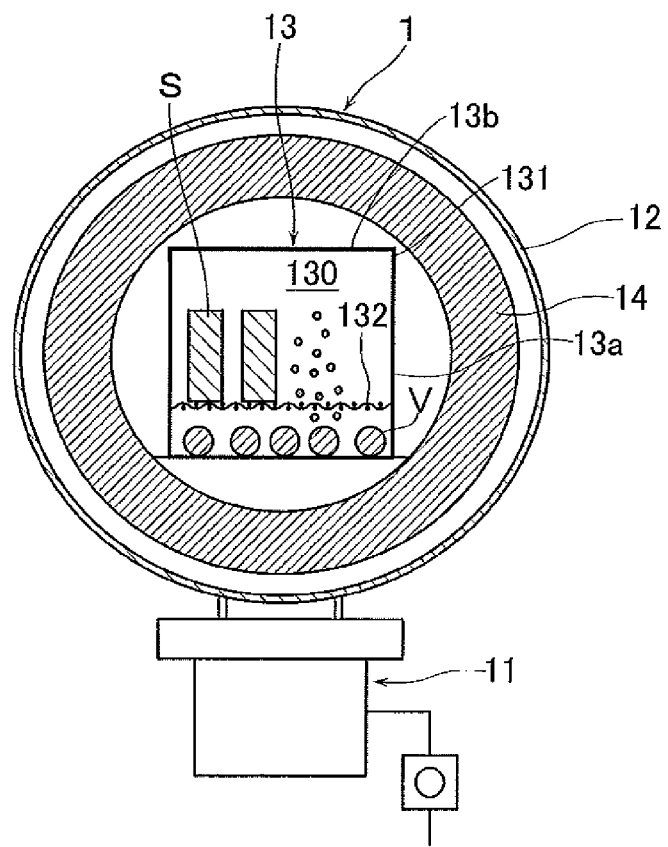
FIG. 2 a schematic view of the vacuum processing apparatus for performing the processing of the present invention.
Figure 3:
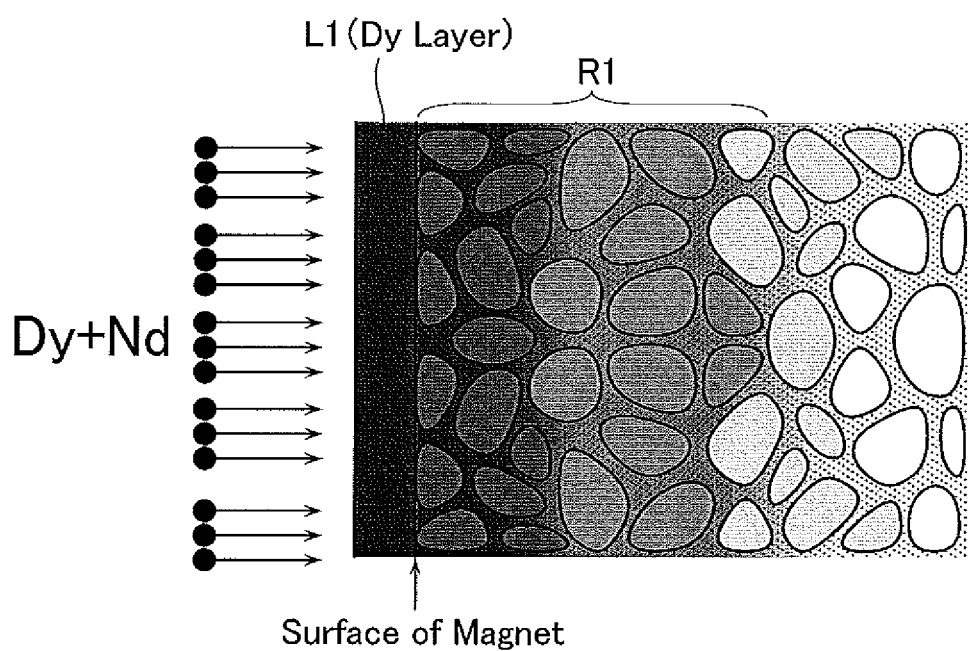
FIG. 3 is a schematic explanatory view of a cross-section of a permanent magnet manufactured in accordance with a prior art.
Figure 4:
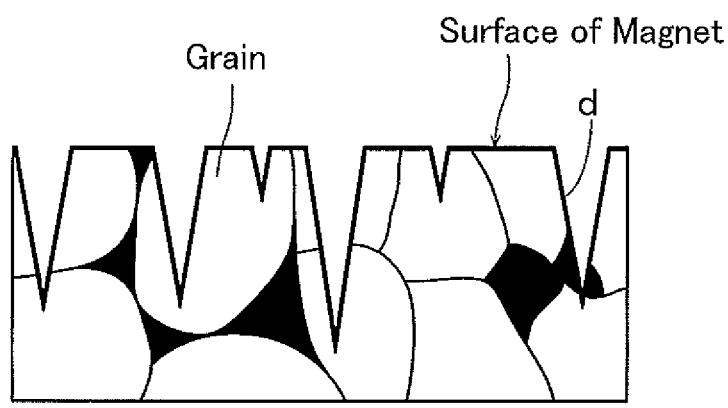
FIG. 4 (a) is an explanatory view showing deterioration of the surface of the sintered magnet caused by machining, and FIG. 4 (b) is an explanatory view showing the surface condition of sintered magnet manufactured in accordance with the present invention.
Figure 4:
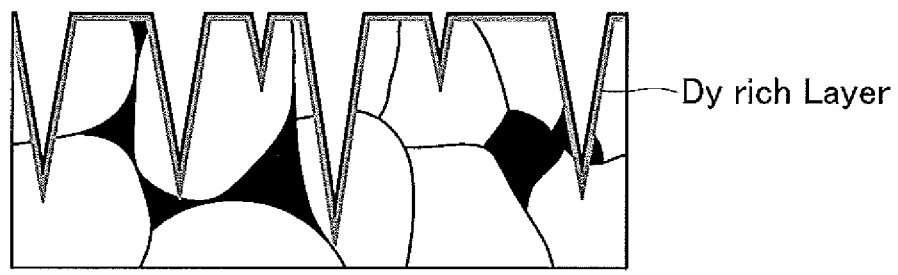
Figure 5:
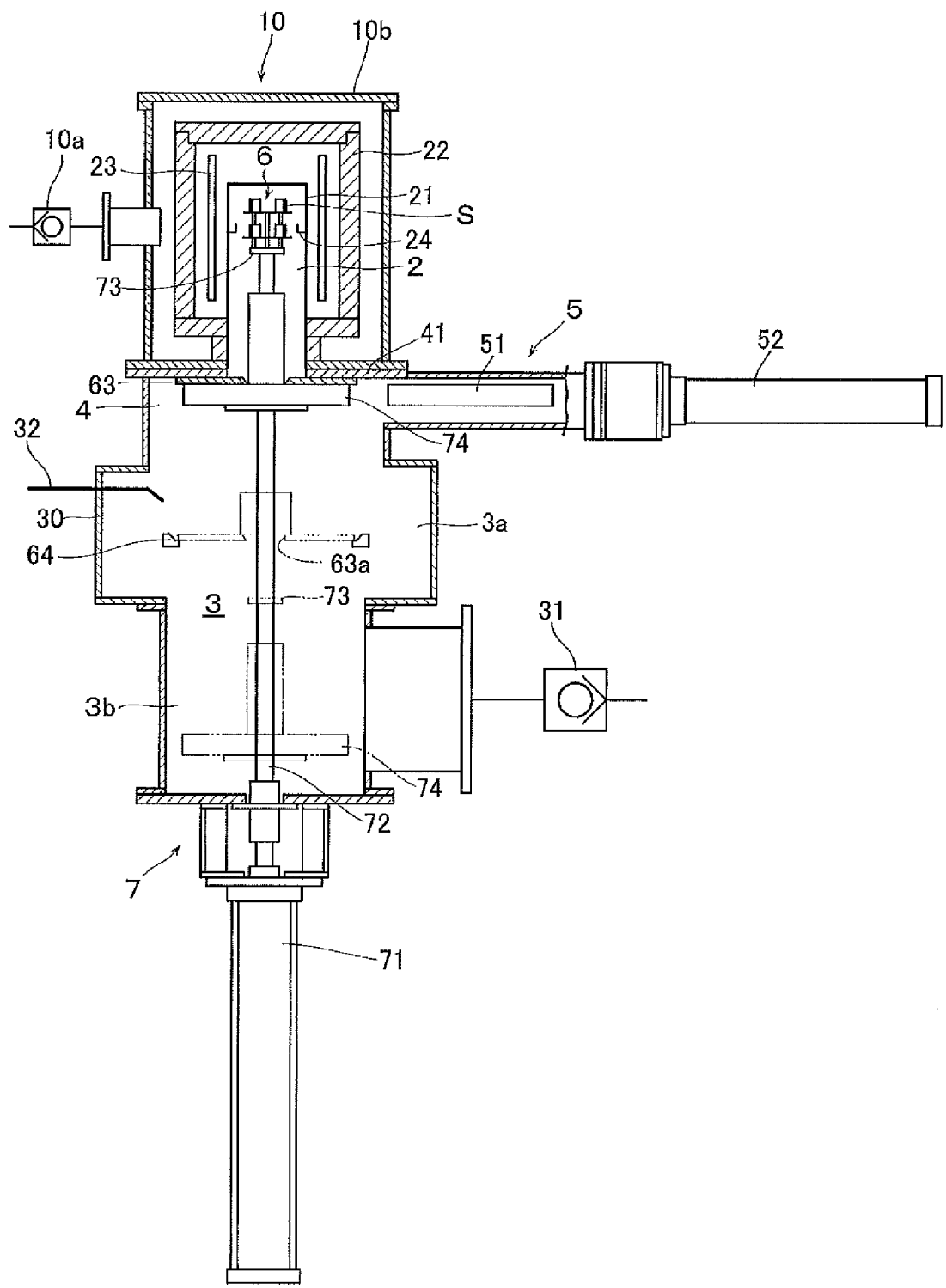
FIG. 5 is a schematic view showing the construction of a film forming apparatus for performing the film-forming step.
Figure 6:
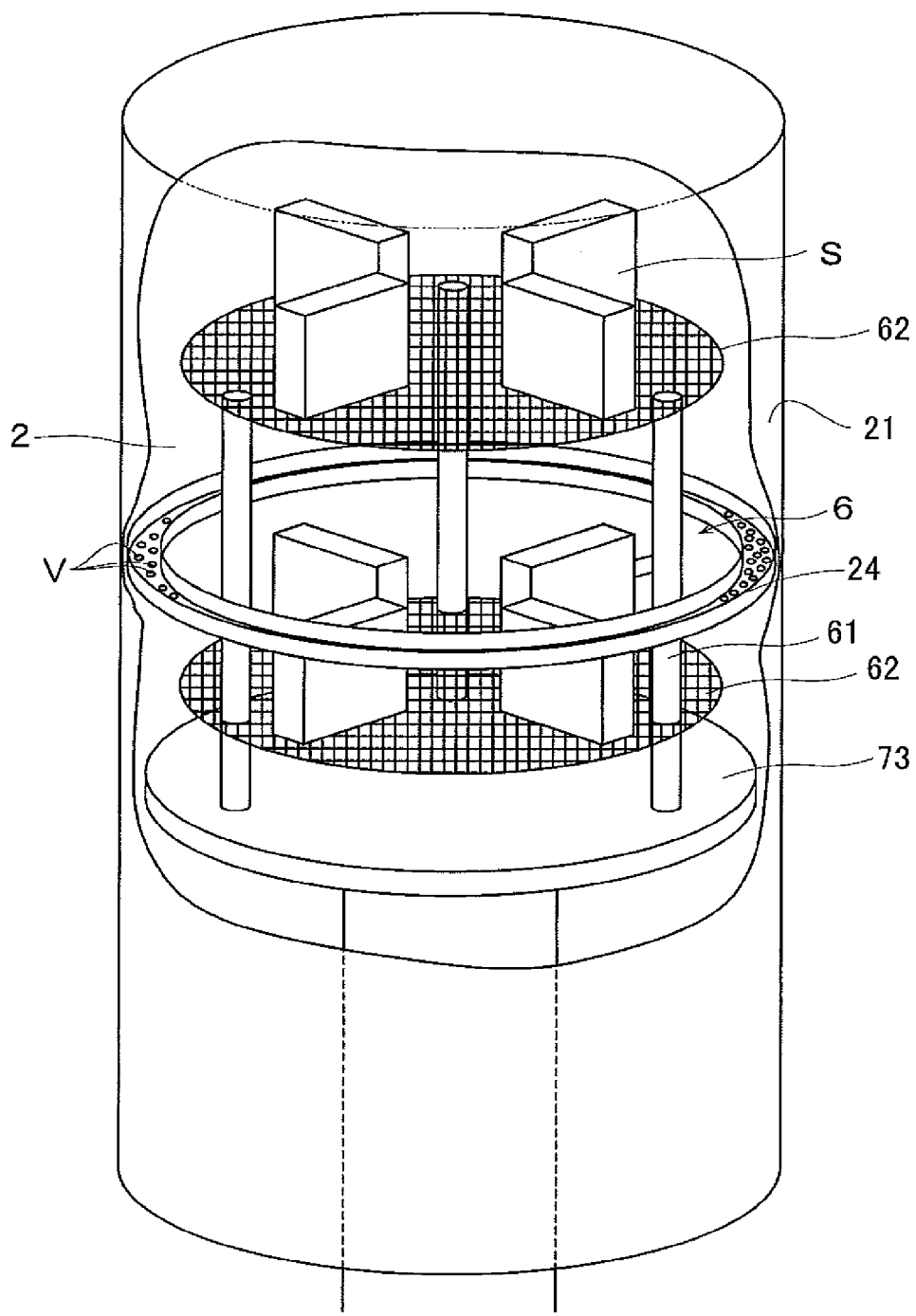
FIG. 6 is a perspective view showing how the sintered magnet is held inside the processing chamber of the film-forming apparatus.

DESCRIPTION OF REFERENCE NUMERALS AND CHARACTERS 1 vacuum vapor processing apparatus
12 vacuum chamber
2 processing chamber
3 heating means
S sintered magnet
M permanent magnet
V metal evaporating material

What is claimed is:

1. A method of manufacturing a permanent magnet comprising:
    a film-forming step comprising:
        heating a total surface area of a metal evaporating material containing at least one of Dy and Tb in order to evaporate metal atoms of the metal evaporating material from the total surface area of the metal evaporating material; and
        adhering the evaporated metal atoms to a surface of an iron-boron-rare earth sintered magnet; and
    a diffusing step of performing heat treatment to diffuse metal atoms adhered to the surface into grain boundary phases of the sintered magnet,
    wherein the metal evaporating material contains at least one of Nd and Pr, and
    a ratio of a the total surface area of the metal evaporating material to a total surface area of the sintered magnet is set to be in a range of $1\times10^{-4}$ to $2\times10^{3}$.

2. The method of manufacturing a permanent magnet according to claim 1, wherein the metal evaporating material further comprises at least one material of the group consisting of Ag, B, Ba, Be, C, Ca, Ce, Co, Cr, Cs, Er, Eu, Fe, Gd, Ge, Hf, Ho, In, K, La, Li, Lu, Mg, Mn, Mo, Na, Nb, Ni, P, Pd, Ru, S, Sb, Si, Sm, Sn, Sr, Ta, Ti, Tm, V, W, Y, Yb, Zn, and Zr.

3. The method of manufacturing a permanent magnet according to claim 1, wherein the metal vapor atmosphere is in a saturated state in the processing chamber.

4. The method of manufacturing a permanent magnet according to claim 1, wherein the film-forming step and the diffusing step are performed by;
    disposing and heating the metal evaporating material and the sintered magnet in a same processing chamber to thereby evaporate the metal evaporating material;
    causing the evaporated metal atoms to be adhered to the surface of the sintered magnet that has been heated to substantially a same temperature as that of the metal evaporating material, the adhering being made while adjusting an amount of supply of the metal atoms; and diffusing the adhered metal atoms into the grain boundary phases of the sintered magnet before a thin film made of the metal evaporating material is formed on the surface of the sintered magnet.

5. The method of manufacturing a permanent magnet according to claim 4, wherein the sintered magnet and the metal evaporating material are disposed at a distance from each other.

6. The method of manufacturing a permanent magnet according to claim 4, wherein a specific surface area of the metal evaporating material to be disposed in the processing chamber is varied to increase or decrease the amount of evaporation at a constant temperature, thereby adjusting the amount of supply of the metal atoms.

7. The method of manufacturing a permanent magnet according to claim 1, wherein, prior to the film-forming step, the processing chamber is reduced to a predetermined pressure and maintaining the pressure thereat after disposing the sintered magnet in the processing chamber.

8. The method of manufacturing a permanent magnet according to claim 7, wherein, after having reduced the processing chamber to the predetermined pressure, the processing chamber is heated to a predetermined temperature and maintaining the temperature thereat.

9. The method of manufacturing a permanent magnet according to claim 1, wherein, prior to the film-forming step, the surface of the sintered magnet is cleaned by plasma.

10. The method of manufacturing a permanent magnet according to claim 1, wherein, after having diffused the metal atoms into the grain boundary phases of the sintered magnet, a heat treatment is performed of removing the strain of the permanent magnet at a temperature lower than the said temperature.

11. The method of manufacturing a permanent magnet according to claim 1, wherein the film-forming step comprises:
   a first step of heating the processing chamber to evaporate the metal evaporating material disposed in the processing chamber to thereby form metal vapor atmosphere in the processing chamber; and
   a second step of transporting the sintered magnet that has been maintained to a temperature lower than the temperature in the processing chamber to thereby selectively cause the metal atoms in the metal vapor atmosphere to adhere to, and deposit on, the surface of the sintered magnet due to a difference in temperature between an inside of the processing chamber and the sintered magnet.

12. The method of manufacturing a permanent magnet according to claim 1, wherein the adhering the evaporated metal atoms to the surface of the iron-boron-rare earth sintered magnet and the diffusing step are performed in a single processing step such that the diffusing step is performed before a thin film containing Dy and Nd is formed on the surface of the sintered magnet.

13. The method of manufacturing a permanent magnet according to claim 1, wherein the metal evaporating material further comprises at least one material of the group consisting of Al, Cu, and Ga.

14. The method of manufacturing a permanent magnet according to claim 13, wherein the metal evaporating material further comprises at least one material of the group consisting of Ag, B, Ba, Be, C, Ca, Ce, Co, Cr, Cs, Er, Eu, Fe, Gd, Ge, Hf, Ho, In, K, La, Li, Lu, Mg, Mn, Mo, Na, Nb, Ni, P, Pd, Ru, S, Sb, Si, Sm, Sn, Sr, Ta, Ti, Tm, V, W, Y, Yb, Zn, and Zr.

15. The method of manufacturing a permanent magnet according to claim 13, wherein the film-forming step comprises;
   a first step of heating the processing chamber to evaporate the metal evaporating material disposed in the processing chamber to thereby form metal vapor atmosphere in the processing chamber; and
   a second step of transporting the sintered magnet that has been maintained to a temperature lower than the temperature in the processing chamber to thereby selectively cause the metal atoms in the metal vapor atmosphere to adhere to, and deposit on, the surface of the sintered magnet due to a difference in temperature between an inside of the processing chamber and the sintered magnet.

16. The method of manufacturing a permanent magnet according to claim 13, wherein the film-forming step and the diffusing step are performed by;
   disposing and heating the metal evaporating material and the sintered magnet in a same processing chamber to thereby evaporate the metal evaporating material;
   causing the evaporated metal atoms to be adhered to the surface of the sintered magnet that has been heated to substantially a same temperature as that of the metal evaporating material, the adhering being made while adjusting an amount of supply of the metal atoms; and
   diffusing the adhered metal atoms into the grain boundary phases of the sintered magnet before a thin film made of the metal evaporating material is formed on the surface of the sintered magnet.

17. The method of manufacturing a permanent magnet according to claim 13, wherein, prior to the film-forming step, the processing chamber is reduced to a predetermined pressure and maintaining the pressure thereat after disposing the sintered magnet in the processing chamber.

* * * * *